US006366223B1

United States Patent
Lee et al.

(10) Patent No.: US 6,366,223 B1
(45) Date of Patent: Apr. 2, 2002

(54) METHODS FOR CODING AND DECODING NIBBLE INVERSION CODES AND BLOCK INVERSION CODES AND CODING AND DECODING APPARATUS FOR THE SAME

(75) Inventors: Bhum Cheol Lee; Bong Soo Kim; Hee Bum Jung; Kwon Chul Park; Seok Youl Kang, all of Taejon (KR)

(73) Assignees: Electronics and Telecommunications Research Institute, Taejon; Korea Telecommunications Authority, Kyunggi-Do, both of (KR)

( * ) Notice: Subject to any disclaimer, the term of this patent is extended or adjusted under 35 U.S.C. 154(b) by 0 days.

(21) Appl. No.: 09/350,097

(22) Filed: Jul. 9, 1999

(30) Foreign Application Priority Data

Jul. 13, 1998 (KR) .............................. 98-28198

(51) Int. Cl.[7] .......................... H03M 7/00; H03M 7/38
(52) U.S. Cl. ............................. 341/51; 341/59
(58) Field of Search ................... 341/51, 50, 58, 341/59

(56) References Cited

U.S. PATENT DOCUMENTS

| | | | | |
|---|---|---|---|---|
| 4,486,739 A | | 12/1984 | Franaszek et al. ....... | 340/347 D |
| 4,786,890 A | | 11/1988 | Marcus et al. ............ | 341/81 |
| 5,818,362 A | * | 10/1998 | Walker ..................... | 341/57 |
| 5,892,466 A | * | 4/1999 | Walker ..................... | 341/57 |

OTHER PUBLICATIONS

"A DC–Balanced, Partitioned–Block, 8B/10B Transmission Code" by A.X. Widmer and P.A. Franaszek, IBM J. Res. Develop., vol. 5, pp. 440–451, 1983.
Transmission Performance Analysis of a New Class of Line Codes for Optical Fiber Systems, by Witold A. Krzymien, appearing in IEEE Transactions of Communications, vol. 37, No. 4, Apr. 1989, pp. 402–404.
"Interfaces For Digital Component Video Signals in 525–Line and 625–Line Television Systems", Recommendation 656, appearing in CCIR vol. XI–1 90, ©International Telecommunications Union (1986), pp. 105–117.
"Efficient Spectrum Utilization Using Probabilistic Methods", Report 656, appearing in CCIR vol. I 90, ©International Telecommunications Union (1978), pp. 358–366.
"DmB1M Code and its Performance in a Very High–Speed Optical Transmission System", by Satoki Kawanishi et al, appearing in IEEE Transactions on Communications, vol. 36, No. 8, Aug. 1988, pp. 951–956.

* cited by examiner

Primary Examiner—Michael Tokar
Assistant Examiner—Daniel D. Chang
(74) Attorney, Agent, or Firm—Antonelli, Terry, Stout & Kraus, LLP

(57) ABSTRACT

A nibble inversion and block inversion code coding and decoding method and a coding and decoding apparatus for the same. The apparatus includes a disparity calculator for receiving a pre-code in which a nibble-inverted indication (NII) bit is added at the position next to the LSB of a source data of a n-bit (n represents an odd number higher than 3), computing a disparity $D_{pc}$ value of the pre-code, computing a disparity value $D_{ni}$ of the odd bit nibble-inverted pre-code, decoding a code type in accordance with the value of the register and the value of the running digital sum RDS which represent the disparity code and outputting a control signal for manipulating the bits of the pre-code; a RDS calculator for outputting a RDS value which is obtained by accumulatively summing the disparity of the calculated code word by the unit of blocks for selecting a code word or a complement code word when the computed disparity $D_{pc}$ is not 0; and a bit manipulator for selecting a nibble-inverted and block-inverted (NIBI) code type in accordance with a control signal from the disparity calculator, manipulating a bit of the inputted pre-code and generating a code word or a complement code word, for thereby providing a transition and a DC spectrum component of 0, using a 1-bit redundancy bit when a predetermined n-bit (n represents odd number) is coded, providing multiple frame patterns, and fully providing an in-band and out-band signal.

6 Claims, 7 Drawing Sheets

METHODS FOR CODING AND DECODING NIBBLE INVERSION CODES AND BLOCK INVERSION CODES AND CODING AND DECODING APPARATUS FOR THE SAME

BACKGROUND OF THE INVENTION

1. Field of the Invention

The present invention relates to line codes used for a transmission, interconnection and storing apparatus, in particular to methods for coding and decoding nibble inversion codes and block inversion codes and coding and decoding apparatus for the same which are capable of implementing an easier clock recovery, using one redundancy bit for a decoding operation, providing multiple frame synchronization code words, fully providing in-band and out-band signals, adapting a basic principle of a coding operation even when source byte data is not consist of 8 bit, and being easily adaptable to a hardware in a state that there are not DC spectrum components.

2. Description of the Conventional Art

According to the article of "Principles of digital line coding" by K. W. Cattermole, Int. J. electronics, Vol. 55, No. 1, pp. 3–33, 1983, it is known that the line coding is used for reliably recovering data bits from a serial bit stream. In addition, in the article of "A DC-balanced, partitioned-block, 8B10B transmission code" by A. X. Widmer and P. A. Franaszek, IBM J. Res. Develop., Vol. 5, pp. 440–451, 1983, the features such as a frame synchronization pattern and an in-band signal (special characters such as comma, identifier, empty character, etc.) are disclosed.

The line coding used for a physical layer in a communication transmission field requires a clock recovery and optical connection. Therefore, enough transition should be generated for a serial bit stream for the clock recovery. In addition, the DC frequency components should be 0 (zero) for implementing an AC coupling for the optical connection (R. M. Brooks and A. Jessop, "Line coding for optical fiber systems", Int. J. Electronics. Vol. 55, No. 1, pp. 81–120, 1983).

For implementing the above-described functions, a Manchester code, a CMI (Code Mark Inversion) code, and a 5B6B code are widely used. However, the above-described codes use the redundancy bits which decrease coding efficiency, and when the above-described codes are used in systems that process the codes byte by byte, it is very complicating and inconvenient.

In the field of the communication transmission, the scrambled zero non-return (scrambled NRZ) code which maximizes the coding efficiency is widely used. However, the scrambled NRZ secures DC frequency components of 0 statistically, not perfectly. The scrambled NRZ does not provide a frame synchronization pattern and an in-band signal.

In addition, a 8B10B code which has high coding efficiency in order to overcome the above-described problems in the computer network transmission field and is capable of providing an in-band signal (or a special character) is disclosed in P. A. Franaszek and A. X. Widmer, "Byte oriented DC balanced 8B10B partitioned block transmission code", U.S. Pat. Ser. No. 4,486,739. However, even though the above-described 8B10B code overcomes the problems encountered in the pre-codes, there are still problems that when the out-band signal or the frame synchronization pattern is inserted. In the 8B10B code, the out-band signal or the frame synchronization patterns should be inserted into a user source data field because a byte generally consists of 8 bits. Also the 8B10B code is impossible to obtain a uniform and symmetrical characteristic of coding rule when coding the source data is not consist of 8 bit such as 9-bit or 16-bit signal. Namely, since 2-bit redundancy bits are added to the 8-bit signal of the source data byte, when the frame synchronization pattern or a signal bit is inserted, it is impossible to add a redundancy bit to the code word so that user frame format should be changed. In addition, when coding the data except for the 8-bit signal, the code algorithm should be fully changed.

According to the article of W. A. Krzymein, "Transmission performance analysis of a new class of line codes for optical fiber systems", IEEE Trans. Commun., Vol. 37, No. 4, pp. 402–404, April 1989, the Partially flipped mB (m+1)B code is disclosed. This code forms a code word of m+1 bit by inserting a 1 bit redundancy bit into a m-bit source data character. In addition, this code implements a code operation using a disparity of a source data character and a running digital sum (RDS) which are code parameters. However, this code has a good coding efficiency and is simply used, but a synchronization code and in-band and out-band are not provided. Therefore, it is impossible to obtain good coding performance of a RDS, disparity, digital sum variation (DSV) and a run length.

SUMMARY OF THE INVENTION

It is an object of the present invention to provide methods for coding and decoding nibble inversion codes and block inversion codes and coding and decoding apparatus for the same which are capable of providing transition and DC spectrum components of 0, using a 1-bit redundancy bit when a predetermined n-bit (n represents odd number) is coded, providing multiple frame patterns, providing an in-band and out-band signals enough, and detecting a bit error by a code violation detection based on a simple hardware.

In order to achieve the above objects, there are provided methods for coding nibble inversion codes and block inversion codes according to a first embodiment of the present invention which include the steps of a first step for adding a one redundancy bit to a n-bit (n represents an odd number larger than 3) source data and generating a pre-code, a second step for setting the pre-code as a code word when a disparity of the pre-code generated in the first step is 0 and the source data is not an in-band signal (or special character), a third step for inverting a half bit (nibble) including a redundancy bit among the bits (block) forming a pre-code when the disparity of the pre-code generated in the first step is 0 and the source data is a set in-band signal (or special character), setting the nibble-inverted pre-code as a code word and generating a complement code word which is a block-inverted code word version and a code word, a fourth step for nibble-inverting a pre-code when the disparity of the pre-code generated in the first step is not 0, setting a nibble-inverted pre-code as a code word when the disparity of the nibble-inverted pre-code is within a predefined value and generating a complement code word which is a block-inverted code word and a code word when the disparity of the set code word is not 0, a fifth step or nibble-inverting the pre-code when the disparity of the pre-code generated in the first step is not 0, manipulating the bits of the pre-code when the disparity of the nibble-inverted pre-code is not within a predefined value, manipulating the bits of the pre-code so that the disparity of the nibble-inverted pre-code is within a predefined value when the disparity of the manipulated pre-code is 0 and concurrently manipulated, setting the manipulated and nibble-inverted pre-code as a code word, and generating a complement code word which is a block-inverted code word version and a code word when the disparity of the set code word is not 0, a sixth step for selecting a code word in which the absolute value of the running digital sum (RDS) is decreased when the code with respect to the source data exists as two values of a complement code word and a code word, and a seventh step for combining the code words for a frame synchronization and generating a synchronization code word so that a unique pattern exists in a serial bit stream when the code word is converted from a parallel form to a serial form.

In order to achieve the above objects, there is provided a nibble inversion and block inversion code coding and decoding method according to a second embodiment of the present invention which includes the steps of a first step for decoding a source data bits except for a redundancy bit from a code word when a disparity of a code word is 0 and a redundancy bit is not inverted, a second step for nibble-inverting half bits (nibble) including a redundancy bit among the bits of the code word when the dispari ty of the code word is 0 and the redundancy bit is inverted and decoding a source data bits except for the redundancy bit of the nibble-inverted code word, a third step for nibble-inverting half bits including a redundancy bit among the bits of the code word when the disparity of the code word is not 0 and has a predefined value and decoding a source data bits except for the redundancy bits from the code word when the disparity of the nibble-inverted code word is not 0 and the redundancy bit of the nibble-inverted code word is not inverted, a fourth step for nibble-inverting when the disparity of the code word is not 0 and has a pres-set value, block-inverting the bits (block) of a decode word when the disparity of the nibble-inverted code word is not 0 and the redundancy bit of the nibble-inverted code word is inverted, a fifth step for nibble-inverting when the disparity of the code word is not 0 and has a predefined value, nibble-inverting when the disparity of the nibble-inverted code word is 0 and is a synchronization or in-band signal (or special) code word, indicating an in-band signal (or special) character signal decoding the source data using the bits except for the redundancy bit from the block-inverted code word when the redundancy bit of the nibble-inverted code word is inverted, decoding the source data bits except for the redundancy bit from the nibble-inverted code word when the redundancy bit of the nibble-inverted code word is not inverted, and indicating an in-band signal (or special) character signal, a sixth step for nibble-inverting when the disparity of the code word is not 0 and has a predefined value, nibble-inverting after searching and recovering the manipulated bits when the disparity of the nibble-inverted code word is 0 and a bit-manipulated code word, decoding a source data bits except for the redundancy bit from the block-inverted code word when the redundancy bit of the recovered and nibble-inverted code word is inverted, and decoding the source data using the bits except for the redundancy bit from the recovered and nibble-inverted code word when the redundancy bit of the nibble-inverted code word is not inverted, a seventh step for decoding based on the above-described condition and process when a predefined frame synchronization pattern is detected from the code word stream and decoding a synchronization character, and an eighth step for detecting the code word as a violation when the running digital sum exceeds a predefined value or the disparity of the code word exceeds a predefined value.

In order to achieve the above objects, there is provided a nibble inversion and block inversion code coding and decoding apparatus according to a third embodiment of the present invention which includes a disparity calculator for receiving a pre-code in which a nibble-inverted indication (NII) bit is added at the position next to the LSB of a source data of a n-bit (n represents an odd number larger than 3), computing a disparity Dpc of the pre-code, computing a disparity Dni of the odd bit nibble-inverted pre-code, decoding a code type in accordance with the value of the register and the running digital sum RDS which represent the disparity code and outputting a control signal for manipulating the bits of the pre-code; a RDS calculator for outputting a RDS which is obtained by accumulatively summing the disparity of the calculated code word by the unit of blocks for selecting a code word or a complement code word when the computed disparity Dpc is not 0; and a bit manipulator for selecting a nibble-inverted and block-inverted (NIBI) code type in accordance with a control signal from the disparity calculator, manipulating a bit of the inputted pre-code and generating a code word or a complement code word.

In order to achieve the above objects, there is provided a nibble inversion and block inversion code coding and decoding apparatus according to a fourth embodiment of the present invention which includes a disparity calculator for receiving a block synchronized code word, calculating a disparity Dcw of the code word, computing a disparity Dni of the nibble-inverted code word, decoding a NIBI decoding type in accordance with a computed disparity value and a bit pattern of a code word and generating a control signal for manipulating the bits of the code word; a RDS calculator for outputting a RDS which is obtained by accumulatively summing the disparity Dni of the computed code word by the unit of blocks; and a bit manipulator for selecting a NIBI decoding type in accordance with a control signal of the disparity calculator, manipulating a bit of the code word, and recovering the original character.

Additional advantages, objects and other features of the invention will be set forth in part in the description which follows and in part will become apparent to those having ordinary skill in the art upon examination of the following or may be learned from practice of the invention. The objects and advantages of the invention may be realized and attained as particularly pointed out in the appended claims as a result of the experiment compared to the conventional arts.

BRIEF DESCRIPTION OF THE DRAWINGS

The present invention will become more fully understood from the detailed description given hereinbelow and the accompanying drawings which are given by way of illustration only, and thus are not limitative of the present invention, and wherein.

DETAILED DESCRIPTION OF THE INVENTION

Figure 1A:
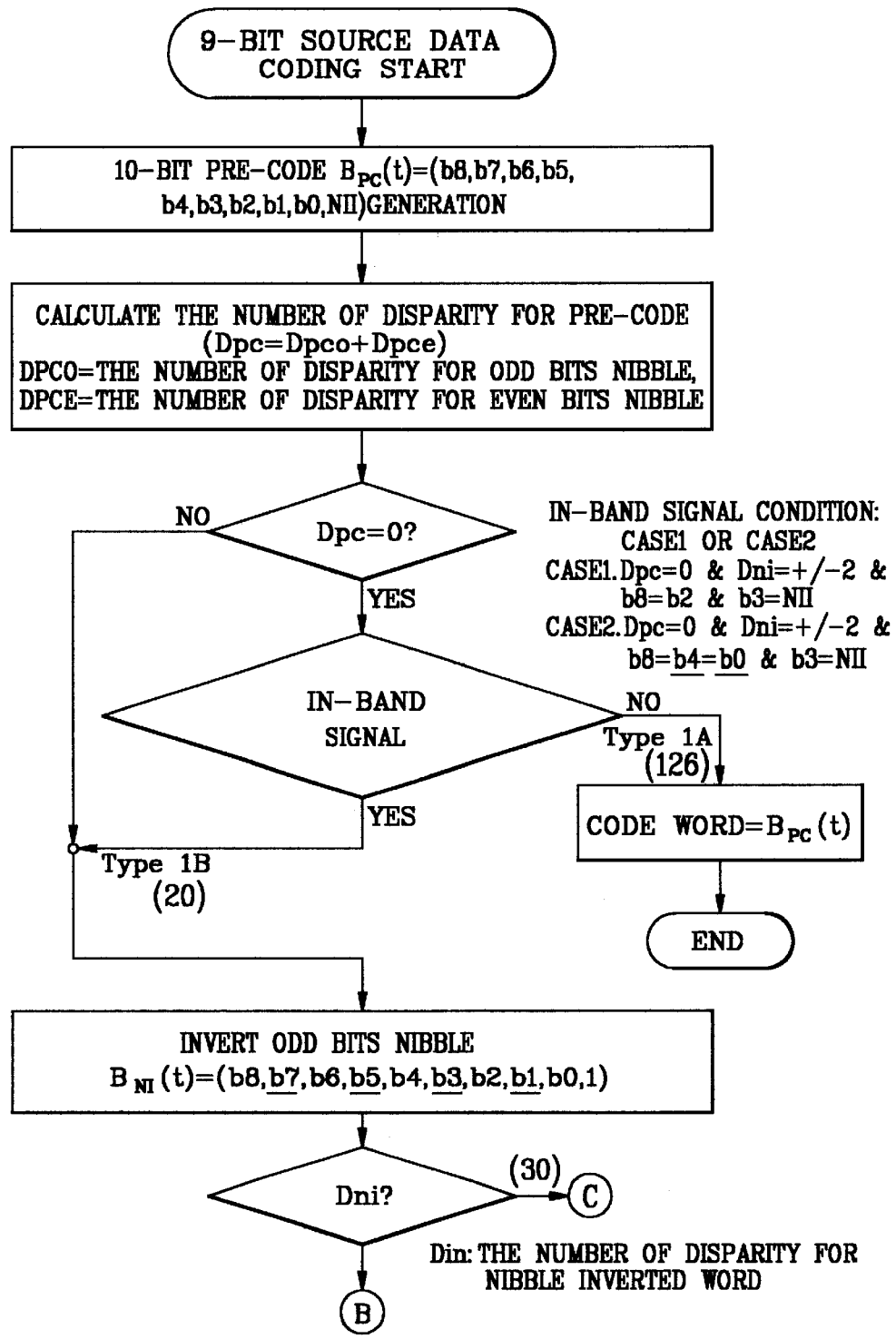
FIGS. 1A through 1C are flow charts illustrating a NIBI coding operation according to the present invention.

The technical terms used in the description of the present invention are defined as follows for providing a simple construction and operation of the present invention.

Disparity: In the code word, it represents a difference between the number of 1 (ones) and the number of 0

(zeros), and disparity is the positive integer, if the amount of 0 is more than 1, and if the amount of 0 is less than 1, disparity is the negative integer.

RDS (Running digital sum): The accumulated sum of disparities of the code words finally transmitted at a corresponding time from a predetermined set time.

Source data: Primitive data generated by machine or user.

Code word: Data word expressed by a method having a rule.

Pre-code: Code which is formed by inserting one bit to a source data for a coding operation (the inserted Bit is a logic level of 0).

Nibble: Half of the bits of a pre-code or a code word.

Block: Bits of a code word.

Character: Bits of source data.

Digital sum variation (DSV): Difference between maximum value and minimum value of the possible digital sums in a coded stream of a predetermined code.

The coding method for nibble inversion codes and block inversion codes according to the present invention will be explained.

In addition, NIBI encoding and decoding algorithm will be explained as follows.

NIBI (Nibble Inversion Block Inversion) code is related to line codes used for the transmission and interconnection. It is a transmission code with high performance as follows:

it is easy for clock recovery, it does not have DC spectrum components, it uses only one redundancy bit to encode, it providing various frame synchronization patterns, it also providing sufficient in-band and out-band signaling signals, it follows the same coding rules even the source data byte is octet or character or word, it is easily implemented into hardware.

NIBI coding performance is as follows: Disparity is less than 5, RDS (Running Digital Sum) is less than 7, and the maximum run 1's or 0's length is 12. The source data are 9-bit characters, a encoded code word is called a block. NIBI encoder adds NII (Nibble Inversion Indication) bit next the LSB of the character consisting of b(8:0) to generate a 10-bit pre-code. In other words, it makes a pre-code composed of b8, b7, b6, b5, b4, b3, b2, b1, b0, and NII (NII=0), where b8 is the MSB, and NII is the new LSB. The odd bit nibble is composed of <u>b7</u>, <u>b5</u>, <u>b3</u>, <u>b1</u> and NII. The even bit nibble is composed of b8, b6, b2 and b0. The odd bit nibble inversion takes the complements of odd bit, generating <u>b7</u>, <u>b5</u>, <u>b3</u>, <u>b1</u>, and NII, where <u>b7</u> is the complement of b7. If the code word is <u>c</u>(9:0), the block inversion is the complement of the code word, c(9:0). The NIBI coding rules are described using a flow chart in FIG. 1. For the convenience of computing disparity and the simplicity of hardware implementation, NIBI encoder calculates odd bit nibble disparity (Dpco) of the pre-code and even bit nibble disparity (Dpce) of the pre-code, and adds the odd bit nibble disparity to the even bit nibble disparity to calculate the disparity of the pre-code (Dpc). The even bit nibble disparity (Dpce) can be used to calculate disparity (Dni) for the odd bit nibble inverted pre-code. RDS sums up the disparity of the each code word; RDS of NIBI code is +6 at the maximum, and −6 at the minimum. If the disparity of a code word is not 0, the code word has the complement code word version. The complement code word is generated by block inverting the code word. The coding rules according to the NIBI coding types are as follows:

1. If Dpc=0, the pre-code is the code word (Type 1A)
2. If Dpc≠0, and Dni=0 or +/−2 or +/−4, the nibble inverted (where 'nibble inverted' means 'odd bit nibble inverted') pre-code is the code word. If Dni=0, the complement code word version that is block-inverted is also generated (Type 2).
3. If Dpc≠0 and Dni=+/−6, it manipulates bits in the pre-code to make the zero disparity of the bit-manipulated pre-code, and to make +/−2 disparity of the bit-manipulated and nibble-inverted pre-code. And the block inverted complement code version is also generated (Type 3A, Type 3B and Type 3C).

If Dpc≠0 and Dni=+/−6 and Dpco=−5 and not b2=b0=0 (b2≠0 or b0≠0), the bit manipulator inverts b7 and b3 of the pre-code respectively. And it inverts the odd bit nibble of the pre-code to generate the code word and the block inverted complement code word version (Type 3A).

If Dpc=≠0 and Dni=+/−6 and Dpco=−5, the bit manipulator inverts b0 and b2 of the pre-code respectively. And it inverts odd bit nibble of pre-code to generate the code word and the block inverted complement code word version (Type 3B).

If Dpc≠0 and Dni=+/−6 and Dpco=−5 and b2=b0=0, the bit manipulator inverts b5, b4, b3 and b2 of the pre-code respectively. And it inverts the odd bit nibble to generate the code word and the block inverted complement code word version (Type 3C).

4. If Dpc≠0 and Dni=+/−8, it manipulates bits in the pre-code to make the zero disparity of the bit manipulated pre-code, and to make +/−2 disparity of the bit manipulated and nibble inverted pre-code. And the block inverted complement code is also generated (Type 4A, Type 4B).

If Dpc=≠0 and Dni=+/−8 and Dpco=−5 and b4=b2=1, or if Dpc≠0 and Dni=+/−8 and Dpco≠−5 and not b5=b3=b1, the bit manipulator inverts b5, b4, b3, b2, and b1 of the pre-code respectively. And it inverts the odd bit nibble pre-code to generate the code word and the block inverted complement de word version (Type 4A).

If Dpc≠0 and Dni=+/−8 and Dpco=−5 and not b4=b2=1, or if Dpc≠0 and Dni=+/−8 and Dpco≠−5 and b5=b3=b1, the bit manipulator inverts b6, b5, b4, b3 and b2 of the pre-code respectively. And it inverts the odd bit nibble of pre-code to generate the code word and the block inverted complement ode word version (Type 4B).

5. If Dpc=0 and the character is an in-band signaling/special character, the bit manipulator inverts odd bit nibble of the pre-code which is not used in Type 3A, Type 3B, Type 3C, Type 4A and Type 4B code word. As disparity of the nibble-inverted pre-code is +/−2, and the code word has a complement code version (Type 1B).

For 512 9-bit source characters, each NIBI coding type can be categorized as followings. 126 code words for Type 1A, 20 in-band signaling/special code words for Type 1B, 356 code words for Type 2, 9 code words for Type 3A, 10 code words for Type 3B, 1 code word for Type 3C, 6 code words for Type 4A, 4 code words for Type 4B. And it has 280 complement code words. If the disparity of the code word is non-zero, it decides whether the code word is selected or the complement code word is selected according to the RDS. RDS at the time of t is defined as RDS(t), the disparity sign of the time of t is defined as R(t), RDS at the time of t+1 defined as RDS(t+1), and the disparity sign of the time of t+1 defined as R(t+1), the coding rules of the code word with the complement code word are as follows:

1. If RDS(t)>0, it selects the code word with negative disparity at the time of t+1.
2. If RDS(t)<0, it selects the code word with positive disparity at the time of t+1.
3. If RDS(t)=0, and R(t)=1(the disparity has positive value at the time of t), it selects the code word with negative disparity at the time of t+1.
4. If RDS(t)=0, and R(t)=0 (the disparity has negative value at the time of t), it selects the code word with positive disparity at the time of t+1.
5. For the synchronization codes, it does not follow the coding rules above, but follow the special coding rules described below.

As a result, RDS reaches only +/−4 if the above coding rules apply. The NIBI code provides the synchronization characters for frame synchronization or block synchronization. The synchronization characters appear as unique patterns in serial bit stream. In the NIBI code, unfortunately, unique patterns are not generated in a single character. If a combine pattern of an arbitrary in-band signaling/special code word and an arbitrary code word is unique in serial bit stream (or as comparing with other combinations of arbitrary code words), the in-band signaling/special code word and the code word can be used as synchronization characters.

Synchronization code words follow the following coding rules.

1. If the disparity of the synchronization in-band signaling/special code word selected at the time of t is +2, the disparity of the synchronization code word selected at the moment of t+1 is +4.
2. If the disparity of the synchronization in-band signaling (or special). code word selected at the time of t is −2, the disparity of the synchronization code word selected at the time of t+1 is −4.

The code-book according to the NIBI coding rules is shown in Table 1a.

TABLE 1a

NIBI CODE BOOK FOR 9-BIT SOURCE DATA

| CHARACTER NO | SOURCE DATE BIT FORMAT | CODE WORD | COMPLEMENT WORD | D |
|---|---|---|---|---|
| [0] | 000000000 | 0101010101 | | 0 |
| [1] | 000000001 | 0101010111 | 1010101000 | 2 |
| [2] | 000000010 | 0101010001 | 1010101110 | −2 |
| [3] | 000000011 | 0101010011 | | 0 |
| [4] | 000000100 | 0101011101 | 1010100010 | 2 |
| [5] | 000000101 | 0101011111 | 1010100000 | 4 |
| [6] | 000000110 | 0101011001 | | 0 |
| [7] | 000000111 | 0101011011 | 1010100100 | 2 |
| [8] | 000001000 | 0101000101 | 1010111010 | −2 |
| [9] | 000001001 | 0101000111 | | 0 |
| [10] | 000001010 | 0101000001 | 1010111110 | −4 |
| [11] | 000001011 | 0101000011 | 1010111100 | −2 |
| [12] | 000001100 | 0101001101 | | 0 |
| [13] | 000001101 | 0101001111 | 1010110000 | 2 |
| [14] | 000001110 | 0101001001 | 1010110110 | −2 |
| [15] | 000001111 | 0101001011 | | 0 |
| [16] | 000010000 | 0101110101 | 1010001010 | 2 |
| [17] | 000010001 | 0101110111 | 1010001000 | 4 |
| [18] | 000010010 | 0101110001 | | 0 |
| [19] | 000010011 | 0101110011 | 1010001100 | 2 |
| [20] | 000010100 | 0101111101 | 1010000010 | 4 |
| [21] | 000010110 | 0001101111 | 1110010000 | 2 |

TABLE 1a-continued

NIBI CODE BOOK FOR 9-BIT SOURCE DATA

| CHARACTER NO | SOURCE DATE BIT FORMAT | CODE WORD | COMPLEMENT WORD | D |
|---|---|---|---|---|
| [22] | 000010110 | 0101111001 | 1010000110 | 2 |
| [23] | 000010111 | 0101111011 | 1010000100 | 4 |
| [24] | 000011000 | 0101100101 | | 0 |
| [25] | 000011001 | 0101100111 | 1010011000 | 2 |
| [26] | 000011010 | 0101100001 | 1010011110 | −2 |
| [27] | 000011011 | 0101100011 | | 0 |
| [28] | 000011100 | 0101101101 | 1010010010 | 2 |
| [29] | 000011101 | 0101101111 | 1010010000 | 4 |
| [30] | 000011110 | 0101101001 | | 0 |
| [31] | 000011111 | 0000111110 | | 0 |
| [32] | 000100000 | 0100010101 | 1011101010 | −2 |
| [33] | 000100001 | 0100010111 | | 0 |
| [34] | 000100010 | 0100010001 | 1011101110 | −4 |
| [35] | 000100011 | 0100010011 | 1011101100 | −2 |
| [36] | 000100100 | 0100011101 | | 0 |
| [37] | 000100101 | 0100011111 | 1011100000 | 2 |
| [38] | 000100110 | 0100011001 | 1011100110 | −2 |
| [39] | 000100111 | 0100011011 | | 0 |
| [40] | 000101000 | 0100000101 | | −4 |
| [41] | 000101001 | 0100000111 | 1011111000 | −2 |
| [42] | 000101010 | 0100001011 | 1011110100 | −2 |
| [43] | 000101011 | 0100000011 | 1011111100 | −4 |
| [44] | 000101100 | 0100001101 | 1011110010 | −2 |
| [45] | 000101101 | 0100001111 | | 0 |
| [46s] | 000101110 | 0100001001 | 1011110110 | −4 |
| [47] | 000101111 | 0001011110 | | 0 |
| [48] | 000110000 | 0100110101 | | 0 |
| [49] | 000110001 | 0100110111 | 1011001000 | 2 |
| [50] | 000110010 | 0100110001 | 1011001110 | −2 |
| [51] | 000110011 | 0100110011 | | 0 |
| [52] | 000110100 | 0100111101 | 1011000010 | 2 |
| [53] | 000110101 | 0100111111 | 1011000000 | 4 |
| [54] | 000110110 | 0100111001 | | 0 |
| [55] | 000110111 | 0001101110 | | 0 |
| [56] | 000111000 | 0100100101 | 1011011010 | −2 |
| [57] | 000111001 | 0100100111 | | 0 |
| [58s] | 000111010 | 0100100001 | 1011011110 | −4 |
| [59] | 000111011 | 0001110110 | | 0 |
| [60] | 000111100 | 0100101101 | | 0 |
| [61] | 000111101 | 0001111010 | | 0 |
| [62] | 000111110 | 0001111100 | | 0 |
| [63] | 000111111 | 0100101011 | | 0 |
| [64] | 001000000 | 0111010101 | 1000101010 | 2 |
| [65] | 001000001 | 0111010111 | 1000101000 | 4 |
| [66] | 001000010 | 0111010111 | | 0 |
| [67] | 001000011 | 0111010011 | 1000101100 | 2 |

TABLE 1b

| [68] | 001000100 | 0111011101 | 1000100010 | 4 |
|---|---|---|---|---|
| [69] | 001000101 | 0011001111 | 1100110000 | 2 |
| [70] | 001000110 | 0111011001 | 1000100110 | 2 |
| [71] | 001000111 | 0111011011 | 1000100100 | 4 |
| [72] | 001001000 | 0111000101 | | 0 |
| [73] | 001001001 | 0111000111 | 1000111000 | 2 |
| [74] | 001001010 | 0111000001 | 1000111110 | −2 |
| [75] | 001001011 | 0111000011 | | 0 |
| [76] | 001001100 | 0111001101 | 1000110010 | 2 |
| [77] | 001001101 | 0111001111 | 1000110000 | 4 |
| [78] | 001001110 | 0111001001 | | 0 |
| [79] | 001001111 | 0010011110 | | 0 |
| [80] | 001010000 | 0111110101 | 1000001010 | 4 |
| [81] | 001010001 | 0011100111 | 1100011000 | 2 |
| [82] | 001010010 | 0111110001 | 1000001110 | 2 |
| [83] | 001010011 | 0111110011 | 1000001100 | 4 |
| [84] | 001010100 | 0011101101 | 1100010010 | 2 |
| [85] | 001010101 | 0110000011 | 1001111100 | −2 |
| [86] | 001010110 | 0111111001 | 1000000110 | 4 |
| [87] | 001010111 | 0010101110 | | 0 |
| [88] | 001011000 | 0111100101 | 1000011010 | 2 |
| [89] | 001011001 | 0111100111 | 1000011000 | 4 |

TABLE 1b-continued

| | | | | |
|---|---|---|---|---|
| [90] | 001011010 | 0111100001 | | 0 |
| [91] | 001011011 | 0010110110 | | 0 |
| [92] | 001011100 | 0111101101 | 1000010010 | 4 |
| [93] | 001011101 | 0010111010 | | 0 |
| [94] | 001011110 | 0010111100 | | 0 |
| [95] | 001011111 | 0111101011 | 1000010100 | 4 |
| [96] | 001100000 | 0110010101 | | 0 |
| [97] | 001100001 | 0110010111 | 1001101000 | 2 |
| [98] | 001100010 | 0110010001 | 1001101110 | −2 |
| [99] | 001100011 | 0110010011 | | 0 |
| [100] | 001100100 | 0110011101 | 1001100010 | 2 |
| [101] | 001100101 | 0110011111 | 1001100000 | 4 |
| [102] | 001100110 | 0110011001 | | 0 |
| [103] | 001100111 | 0011001110 | | 0 |
| [104] | 001101000 | 0110000101 | 1001111010 | −2 |
| [105] | 001101001 | 0110000111 | | 0 |
| [106] | 001101010 | 0110000001 | 1001111110 | −4 |
| [107] | 001101011 | 0011010110 | | 0 |
| [108] | 001101100 | 0110001101 | | 0 |
| [109] | 001101101 | 0011011010 | | 0 |
| [110] | 001101110 | 0011011100 | | 0 |
| [111] | 001101111 | 0110001011 | | 0 |
| [112] | 001110000 | 0110110101 | 1001001010 | 2 |
| [113] | 001110001 | 0110110111 | 1001001000 | 4 |
| [114] | 001110010 | 0110110001 | | 0 |
| [115] | 001110011 | 0011100110 | | 0 |
| [116] | 001110100 | 0110111101 | 1001000010 | 4 |
| [117] | 001110101 | 0011101010 | | 0 |
| [118] | 001110110 | 0011101100 | | 0 |
| [119] | 001110111 | 0110111011 | 1001000100 | 4 |
| [120] | 001111000 | 0110100101 | | 0 |
| [121] | 001111001 | 0011110010 | | 0 |
| [122] | 001111010 | 0011110100 | | 0 |
| [123] | 001111011 | 0110100011 | | 0 |
| [124] | 001111100 | 0011111000 | | 0 |
| [125] | 001111101 | 0110101111 | 100101000 | 4 |
| [126] | 001111110 | 0110101001 | | 0 |
| [127] | 001111111 | 0110101011 | 1001010100 | 2 |
| [128] | 010000000 | 0001010101 | 1110101010 | −2 |
| [129] | 010000001 | 0001010111 | | 0 |
| [130] | 010000010 | 0001010001 | 1110101110 | −4 |
| [131] | 010000011 | 0001010011 | 1110101100 | −2 |
| [132] | 010000100 | 0001011101 | | 0 |
| [133] | 010000101 | 0001011111 | 1110100000 | 2 |
| [134] | 010000110 | 0001011011 | 1110100110 | −2 |
| [135] | 010000111 | 0001011011 | | 0 |
| [136] | 010001000 | 0001000101 | 1110111010 | −4 |
| [137] | 010001001 | 0001000111 | 1110111000 | −2 |
| [138] | 010001010 | 0001001011 | 1110110100 | −2 |
| [139s] | 010001011 | 0001000011 | 1110111100 | −4 |
| [140] | 010001100 | 0001001101 | 1110110010 | −2 |
| [141] | 010001101 | 0001001111 | | 0 |

TABLE 1c

| | | | | |
|---|---|---|---|---|
| [142] | 010001110 | 0001001001 | 1110110110 | −4 |
| [143] | 010001111 | 0100011110 | | 0 |
| [144] | 010010000 | 0001110101 | | 0 |
| [145] | 010010001 | 0001110111 | 1110001000 | 2 |
| [146] | 010010010 | 0001110001 | 1110001110 | −2 |
| [147] | 010010011 | 0001110011 | | 0 |
| [148] | 010010100 | 0001111101 | 1110000010 | 2 |
| [149] | 010010101 | 0001111111 | 1110000000 | 4 |
| [150] | 010010110 | 0001111001 | | 0 |
| [151] | 010010111 | 0100101110 | | 0 |
| [152] | 010011000 | 0001100101 | 1110011010 | −2 |
| [153] | 010011001 | 0001100111 | | 0 |
| [154s] | 010011010 | 0001100001 | 1110011110 | −4 |
| [155] | 010011011 | 0100110110 | | 0 |
| [156] | 010011100 | 0001101101 | | 0 |
| [157] | 010011101 | 0100111010 | | 0 |
| [158] | 010011110 | 0100111100 | | 0 |
| [159] | 010011111 | 0001101011 | | 0 |
| [160] | 010100000 | 0000010101 | 1111101010 | −4 |
| [161] | 010100001 | 0000010111 | 1111101000 | −2 |
| [162] | 010100010 | 0000011011 | 1111100100 | −2 |

TABLE 1c-continued

| | | | | |
|---|---|---|---|---|
| [163s] | 010100011 | 0000010011 | 1111101100 | −4 |
| [164] | 010100100 | 0000011101 | 1111100010 | −2 |
| [165] | 010100101 | 0000011111 | | 0 |
| [166] | 010100110 | 0000011001 | 1111100110 | −4 |
| [167] | 010100111 | 0101001110 | | 0 |
| [168] | 010101000 | 0000001111 | 1111110000 | −2 |
| [169] | 010101001 | 0000000111 | 1111111000 | −4 |
| [170] | 010101010 | 0011111001 | 1100000110 | 2 |
| [171] | 010101011 | 0101010110 | | 0 |
| [172] | 010101100 | 0000001101 | 1111110010 | −4 |
| [173] | 010101101 | 0101011010 | | 0 |
| [174] | 010101110 | 0101011100 | | 0 |
| [175] | 010101111 | 0000001011 | 1111110100 | −4 |
| [176] | 010110000 | 0000110101 | 1111001010 | −2 |
| [177] | 010110001 | 0000110111 | | 0 |
| [178s] | 010110010 | 0000110001 | 1111001110 | −4 |
| [179] | 010110011 | 0101100110 | | 0 |
| [180] | 010110100 | 0000111101 | | 0 |
| [181] | 010110101 | 0101101010 | | 0 |
| [182] | 010110110 | 0101101100 | | 0 |
| [183] | 010110111 | 0000111011 | | 0 |
| [184] | 010111000 | 0000100101 | 1111011010 | −4 |
| [185] | 010111001 | 0101110010 | | 0 |
| [186] | 010111010 | 0101110100 | | 0 |
| [187] | 010111011 | 0000100011 | 1111011100 | −4 |
| [188] | 010111100 | 0101111000 | | 0 |
| [189] | 010111101 | 0000101111 | | 0 |
| [190] | 010111110 | 0000101001 | 1111010110 | −4 |
| [191] | 010111111 | 0000101011 | 1111010100 | −2 |
| [192] | 011000000 | 0011010101 | | 0 |
| [193] | 011000001 | 0011010111 | 1100101000 | 2 |
| [194] | 011000010 | 0011010001 | 1100101110 | −2 |
| [195] | 011000011 | 0011010011 | | 0 |
| [196] | 011000100 | 0011011101 | 1100100010 | 2 |
| [197] | 011000101 | 0011011111 | 1100100000 | 4 |
| [198] | 011000110 | 0011011001 | | 0 |
| [199] | 011000111 | 0110001110 | | 0 |
| [200] | 011001000 | 0011000101 | 1100111010 | −2 |
| [201] | 011001001 | 0011000111 | | 0 |
| [202] | 011001010 | 0011000001 | 1100111110 | −4 |
| [203] | 011001011 | 0110010110 | | 0 |
| [204] | 011001101 | 0011001101 | | 0 |
| [205] | 011001101 | 0110011010 | | 0 |
| [206] | 011001110 | 0110011100 | | 0 |
| [208] | 011010000 | 0011110101 | 1100001010 | 2 |
| [209] | 011010001 | 0011110111 | 1100001000 | 4 |
| [210] | 011010010 | 0011110001 | | 0 |
| [211] | 011010011 | 0110100110 | | 0 |
| [212] | 011010100 | 0011111101 | 1100000010 | 4 |
| [213] | 011010101 | 0110101010 | | 0 |
| [214] | 011010110 | 0110101100 | | 0 |
| [215] | 011010111 | 0011111011 | 1100000100 | 4 |

TABLE 1d

| | | | | |
|---|---|---|---|---|
| [216] | 011011000 | 0011100101 | | 0 |
| [217] | 011011001 | 0110110010 | | 0 |
| [218] | 011011010 | 0110110100 | | 0 |
| [219] | 011011011 | 0011100011 | | 0 |
| [220] | 011011100 | 0110111000 | | 0 |
| [221] | 011011101 | 0011101111 | 1100010000 | 4 |
| [222] | 011011110 | 0011101001 | | 0 |
| [223] | 011011111 | 0011101011 | 1100010100 | 2 |
| [224] | 011000000 | 0010010101 | 1101101010 | −2 |
| [225] | 011100001 | 0010010111 | | 0 |
| [226] | 011100010 | 1101101110 | 1101101110 | −4 |
| [227] | 011100011 | 0111000110 | | 0 |
| [228] | 011100100 | 0010011101 | | 0 |
| [229] | 011100101 | 0111001010 | | 0 |
| [230] | 011100110 | 0111001100 | | 0 |
| [231] | 011100111 | 0010011011 | | 0 |
| [232] | 011101000 | 0010000101 | 1101111010 | −4 |
| [233] | 011101001 | 0111010010 | | 0 |
| [234] | 011101010 | 0111010100 | | 0 |
| [235] | 011101100 | 0010000011 | | 0 |
| [236] | 011101101 | 0111011000 | | 0 |

TABLE 1d-continued

| | | | | |
|---|---|---|---|---|
| [237] | 011101101 | 0010001111 | | 0 |
| [238] | 011101110 | 0010001001 | 1101110110 | −4 |
| [239] | 011101111 | 0010001011 | 1101110100 | −2 |
| [240] | 011110000 | 0010110101 | | 0 |
| [241] | 011110001 | 0111100010 | | 0 |
| [242] | 011110010 | 0111100100 | | 0 |
| [243] | 011110011 | 0010110011 | | 0 |
| [244] | 011110100 | 0111101000 | | 0 |
| [245] | 011110101 | 0010011111 | 1101000000 | 4 |
| [246] | 011110110 | 0010111001 | | 0 |
| [247] | 011110111 | 0010011011 | 1101000100 | 2 |
| [248] | 011111000 | 0111110000 | | 0 |
| [249] | 011111001 | 0010100111 | | 0 |
| [250] | 011111010 | 0010100001 | 1101011110 | −4 |
| [251] | 011111011 | 0010100011 | 1101011100 | −2 |
| [252] | 011111100 | 0010101101 | | 0 |
| [253] | 011111101 | 0010101111 | 1101010000 | 2 |
| [254] | 011111110 | 0010101001 | 1101010110 | −2 |
| [255] | 011111111 | 0010101011 | | 0 |
| [256] | 100000000 | 1101010101 | 0010101010 | 2 |
| [257] | 100000001 | 1101010111 | 0010101000 | 4 |
| [258] | 100000010 | 1101010001 | | 0 |
| [259] | 100000011 | 1101010011 | 0010101100 | 2 |
| [260] | 100000100 | 1101011101 | 0010100010 | 4 |
| [261] | 100000101 | 1001001111 | 0110110000 | 2 |
| [262] | 100000110 | 1101011001 | 0010100110 | 2 |
| [263] | 100000111 | 1101011011 | 0010100100 | 4 |
| [264] | 100001000 | 1101000101 | | 0 |
| [265] | 100001001 | 1101000111 | 0010111000 | 2 |
| [266] | 100001010 | 1101000001 | 0010111110 | −2 |
| [267] | 100001011 | 1101000011 | | 0 |
| [268] | 100001100 | 1101001101 | 0010110010 | 2 |
| [269] | 100001101 | 1101001111 | 0010110000 | 4 |
| [270] | 100001110 | 1101001001 | | 0 |
| [271] | 100001111 | 1000011110 | | 0 |
| [272] | 100010000 | 1101110101 | 0010001010 | 4 |
| [273] | 100010001 | 1001100111 | 0110011000 | 2 |
| [274] | 100010010 | 1101110001 | 0010001110 | 2 |
| [275] | 100010011 | 1101110011 | 0010001100 | 4 |
| [276] | 100010100 | 1001101101 | 0110010100 | 2 |
| [277] | 100010101 | 1100000011 | 0011111100 | −2 |
| [278] | 100010110 | 1101111001 | 0010000110 | 4 |
| [279] | 100010111 | 1000101110 | | 0 |
| [280] | 100011000 | 1101100101 | 0010011010 | 2 |
| [281] | 100011001 | 1101110111 | 0010011000 | 4 |
| [282] | 100011010 | 1101100001 | | 0 |
| [283] | 100011011 | 1000110110 | | 0 |
| [284] | 100011100 | 1101101101 | 0010010010 | 4 |
| [285] | 100011101 | 1000111010 | | 0 |
| [286] | 100011110 | 1000111100 | | 0 |
| [287] | 200011111 | 1101101011 | 0010010100 | 4 |
| [288] | 100100000 | 1100010101 | | 0 |
| [289] | 100100001 | 1100010111 | 0011101000 | 2 |

TABLE 1e

| | | | | |
|---|---|---|---|---|
| [290] | 100100010 | 1100010001 | 0011101110 | −2 |
| [291] | 100100011 | 1100010011 | | 0 |
| [293] | 100100100 | 1100011101 | 0011100010 | 2 |
| [294] | 100100110 | 1100011001 | | 0 |
| [295] | 100100111 | 1001001110 | | 0 |
| [296] | 100101000 | 1100000101 | | 0 |
| [297] | 100101001 | 1100000111 | | 0 |
| [298] | 100101010 | 1100000001 | 0011111110 | −4 |
| [299] | 100101011 | 1001010110 | | 0 |
| [300] | 100101100 | 1100001101 | | 0 |
| [301] | 100101101 | 1001011010 | | 0 |
| [302] | 100101110 | 1001011100 | | 0 |
| [303] | 100101111 | 1100001011 | | 0 |
| [304] | 100110000 | 1100110101 | 0011001010 | 2 |
| [305] | 100110001 | 1100110111 | 0011001000 | 4 |
| [306] | 100110010 | 1100110001 | | 0 |
| [307] | 100110011 | 1001100110 | | 0 |
| [308] | 100110100 | 1100111101 | 0011000010 | 4 |
| [309] | 100110101 | 1101101010 | | 0 |
| [310] | 100110110 | 1001101100 | | 0 |

TABLE 1e-continued

| | | | | |
|---|---|---|---|---|
| [311] | 100110111 | 1100111011 | 0011000100 | 4 |
| [312] | 100111000 | 1100100101 | | 0 |
| [313] | 100111001 | 1001110010 | | 0 |
| [314] | 100111010 | 1001110100 | | 0 |
| [315] | 100111011 | 1100100011 | | 0 |
| [316] | 100111100 | 1001111000 | | 0 |
| [317] | 100111101 | 1100101111 | 0011010000 | 4 |
| [318] | 100111110 | 1100101001 | | 0 |
| [319] | 100111111 | 1100101011 | 0011010100 | 2 |
| [320] | 101000000 | 1111010101 | 0000101010 | 4 |
| [321] | 101000001 | 1011000111 | 0100111000 | 2 |
| [322] | 101000010 | 1111010001 | 0000101110 | 2 |
| [323] | 101000011 | 1111010011 | 0000101100 | 4 |
| [324] | 101000100 | 1011001101 | 0100110010 | 2 |
| [325] | 101000101 | 1100100111 | 0011011000 | 2 |
| [326] | 101000110 | 1111011001 | 0000100110 | 4 |
| [327] | 101000111 | 1010001110 | | 0 |
| [328] | 101001000 | 1111000101 | 0000111010 | 2 |
| [329] | 101001001 | 1111000111 | 0000111000 | 4 |
| [330] | 101001010 | 1111000001 | | 0 |
| [331] | 101001011 | 1010010110 | | 0 |
| [332] | 101001100 | 1111001101 | 0000110010 | 4 |
| [333] | 101001101 | 1010011010 | | 0 |
| [334] | 101001110 | 1010011100 | | 0 |
| [335] | 101001111 | 1111001011 | 0000110100 | 4 |
| [336] | 101010000 | 1110001101 | 0001110010 | 2 |
| [337] | 101010001 | 1100001111 | 0011110000 | 2 |
| [338] | 101010010 | 1111110001 | 0000001110 | 4 |
| [339] | 101010011 | 1010100110 | | 0 |
| [340] | 101010100 | 1110000001 | 0001111110 | −2 |
| [341] | 101010101 | 1010101010 | | 0 |
| [342] | 101010110 | 1010101100 | | 0 |
| [343] | 101010111 | 1110000111 | 0001111000 | 2 |
| [344] | 101011000 | 1111100101 | 0000011010 | 4 |
| [345] | 101011001 | 1010110010 | | 0 |
| [346] | 101011010 | 1010110100 | | 0 |
| [347] | 101011011 | 1111100011 | 0000011100 | 4 |
| [348] | 101011100 | 1010111000 | | 0 |
| [349] | 101011101 | 1110010011 | 0001101100 | 2 |
| [350] | 101011110 | 1111101001 | 0000010110 | 4 |
| [351] | 101011111 | 1111100001 | 0000011110 | 2 |
| [352] | 101100000 | 1110010101 | 0001101010 | 2 |
| [353] | 101100001 | 1110010111 | 0001101000 | 4 |
| [354] | 101100010 | 1110010001 | | 0 |
| [355] | 101100011 | 1011000110 | | 0 |
| [356] | 101100100 | 1110011101 | 0001100010 | 4 |
| [357] | 101100101 | 1011001010 | | 0 |
| [358] | 101100110 | 1011001100 | | 0 |
| [359] | 101100111 | 1110011011 | 0001100100 | 4 |
| [360] | 101101000 | 1110000101 | | 0 |
| [361] | 101101001 | 1011010010 | | 0 |
| [362] | 101101010 | 1011010100 | | 0 |
| [363] | 101101011 | 1110000011 | | 0 |

TABLE 1f

| | | | | |
|---|---|---|---|---|
| [364] | 101101100 | 1011011000 | | 0 |
| [365] | 101101101 | 1110001111 | 0001110000 | 4 |
| [366] | 101101110 | 1110001001 | | 0 |
| [367] | 101101111 | 1110001011 | 0001110100 | 2 |
| [368] | 101110000 | 1110110101 | 0001001010 | 4 |
| [369] | 101110001 | 1011100010 | | 0 |
| [370] | 101110010 | 1011100100 | 0 | |
| [371] | 101110011 | 1110110011 | 0001001100 | 4 |
| [372] | 101110100 | 1011101000 | | 0 |
| [373] | 101110101 | 1111000011 | 0000111100 | 2 |
| [374] | 101110110 | 1110111001 | 0001000110 | 4 |
| [375] | 101110111 | 1110110001 | 0001001110 | 2 |
| [376] | 101111000 | 1011110000 | | 0 |
| [377] | 101111001 | 1110100111 | 0001011000 | 4 |
| [378] | 101111010 | 1110100001 | | 0 |
| [379] | 101111011 | 1110100011 | 0001011100 | 2 |
| [380] | 101111100 | 1110101101 | 0001010010 | 4 |
| [381] | 101111101 | 1110100101 | 0001011010 | 2 |
| [382] | 101111110 | 1110101001 | 0001010110 | 2 |
| [383] | 101111111 | 1110101011 | 0001010100 | 4 |

TABLE 1f-continued

| | | | | |
|---|---|---|---|---|
| [384] | 110000000 | 1001010101 | | 0 |
| [385] | 110000001 | 1001010111 | 0110101000 | 2 |
| [386] | 110000010 | 1001010001 | 0110101110 | -2 |
| [387] | 110000011 | 1001010011 | | 0 |
| [388] | 110000100 | 1001011101 | 0110100010 | 2 |
| [389] | 110000101 | 1001011111 | 0110100000 | 4 |
| [390] | 110000110 | 1001011001 | | 0 |
| [391] | 110000111 | 1100001110 | | 0 |
| [392] | 110001000 | 1001000101 | 0110111010 | -2 |
| [393] | 110001001 | 1001000111 | | 0 |
| [394] | 110001010 | 1001000001 | 0110111110 | -4 |
| [395] | 110001011 | 1100010110 | | 0 |
| [396] | 110001100 | 1001001101 | | 0 |
| [397] | 110001101 | 1100011010 | | 0 |
| [398] | 110001110 | 1100011100 | | 0 |
| [399] | 110001111 | 1001001011 | | 0 |
| [400] | 110010000 | 1001110101 | 0110001010 | 2 |
| [401] | 110010001 | 1001110111 | 0110001000 | 1 |
| [402] | 110010010 | 1001110001 | | 0 |
| [403] | 110010011 | 1100100110 | | 0 |
| [404] | 110010100 | 1001111101 | 0110000010 | 4 |
| [405] | 110010101 | 1100101010 | | 0 |
| [406] | 110010110 | 1100101100 | | 0 |
| [407] | 110010111 | 1001111011 | 0110000100 | 4 |
| [408] | 110011000 | 1001100101 | | 0 |
| [409] | 110011001 | 1100110010 | | 0 |
| [410] | 110011010 | 1100110100 | | 0 |
| [411] | 110011011 | 1001100011 | | 0 |
| [412] | 110011100 | 1100111000 | | 0 |
| [413] | 110011101 | 1001101111 | 0110010000 | 4 |
| [414] | 110011110 | 1001101001 | | 0 |
| [415] | 110011111 | 1001101101 | 0110010100 | 2 |
| [416] | 110100000 | 1000010101 | 0111101010 | -2 |
| [417] | 110100001 | 1000010111 | | 0 |
| [418] | 110100010 | 1000010001 | 0111101110 | -4 |
| [419] | 110100011 | 1101000110 | | 0 |
| [420] | 110100100 | 1000011101 | | 0 |
| [421] | 110100101 | 1101001010 | | 0 |
| [422] | 110100110 | 1101001100 | | 0 |
| [423] | 110100111 | 1000011011 | | 0 |
| [424] | 110101000 | 1000000101 | 0111111010 | -4 |
| [425] | 110101001 | 1101010010 | | 0 |
| [426] | 110101010 | 1101010100 | | 0 |
| [427] | 110101011 | 1000000011 | 0111111100 | -4 |
| [428] | 110101100 | 1101011000 | | 0 |
| [429] | 110101101 | 1000001111 | | 0 |
| [430] | 110101111 | 1000001001 | 0111110110 | -4 |
| [431] | 110101111 | 1000001011 | 0111110100 | -2 |
| [432] | 110110000 | 1000110101 | | 0 |
| [433] | 110110001 | 1000110101 | | 0 |
| [434] | 110110010 | 1101100100 | | 0 |
| [435] | 110110011 | 1000110011 | | 0 |
| [436] | 110110100 | 1101101000 | | 0 |
| [437] | 110110101 | 1000111111 | 0111000000 | 4 |

TABLE 1g

| | | | | |
|---|---|---|---|---|
| [438] | 110110110 | 1000111001 | | 0 |
| [439] | 110110111 | 1000111011 | 0111000100 | 2 |
| [440] | 110111000 | 1101110000 | | 0 |
| [441] | 110111001 | 1000100111 | | 0 |
| [442] | 110111010 | 1000100001 | 0111011110 | -4 |
| [443] | 110111011 | 1000100011 | 0111011100 | -2 |
| [444] | 110111100 | 1000101101 | | 0 |
| [445] | 110111101 | 1000101111 | 0111010000 | 2 |
| [446] | 110111110 | 1000101101 | 0111010110 | -2 |
| [447] | 110111111 | 1000101011 | | 0 |
| [448] | 111000000 | 1011010101 | 0100101010 | 2 |
| [449] | 111000001 | 1011010111 | 0100101000 | 4 |
| [450] | 111000010 | 1011010001 | | 0 |
| [451] | 111000011 | 1110000110 | | 0 |
| [452] | 111000100 | 1011011101 | 0100100010 | 4 |
| [453] | 111000101 | 1110001010 | | 0 |
| [454] | 111000110 | 1110001100 | | 0 |
| [455] | 111000111 | 1011011011 | 0100100100 | 4 |
| [456] | 111001000 | 1011000101 | | 0 |

TABLE 1g-continued

| | | | | |
|---|---|---|---|---|
| [457] | 111001001 | 1110010010 | | 0 |
| [458] | 111001010 | 1110010100 | | 0 |
| [459] | 111001011 | 1011000011 | | 0 |
| [460] | 111001100 | 1110011000 | | 0 |
| [461] | 111001101 | 1011001111 | 0100110000 | 4 |
| [462] | 111001110 | 1011001001 | | 0 |
| [463] | 111001111 | 1011001011 | 0100110100 | 2 |
| [464] | 111010000 | 1011110101 | 0100001010 | 4 |
| [465] | 111010001 | 1110100010 | | 0 |
| [466] | 111010010 | 1110100100 | | 0 |
| [467] | 111010011 | 1011110011 | 0100001100 | 4 |
| [468] | 111010100 | 1110101000 | | 0 |
| [469] | 111010101 | 1000000111 | 0111111000 | -2 |
| [470] | 111010110 | 1011111001 | 0100000110 | 4 |
| [471] | 111010111 | 1011110001 | 0100001110 | 2 |
| [472] | 111011000 | 1110110000 | | 0 |
| [473] | 111011001 | 1011100111 | 0100011000 | 4 |
| [474] | 111011010 | 1011100001 | | 0 |
| [475] | 111011011 | 1011110001 | 0100011100 | 2 |
| [476] | 111011100 | 1011101101 | 0100010010 | 4 |
| [477] | 111011101 | 1011100101 | 0100011010 | 2 |
| [478] | 111011110 | 1011101001 | 0100010110 | 2 |
| [479] | 111011111 | 1011101011 | 0100010100 | 4 |
| [480] | 111100000 | 1010010101 | | 0 |
| [481] | 111100001 | 1111000010 | | 0 |
| [482] | 111100010 | 1111000100 | | 0 |
| [483] | 111100011 | 1010010011 | | 0 |
| [484] | 111100100 | 1111001000 | | 0 |
| [485] | 111100101 | 1010011111 | 0101100000 | 4 |
| [486] | 111100110 | 1010011001 | | 0 |
| [487] | 111100111 | 1010011011 | 0101100100 | 2 |
| [488] | 111101000 | 1111010000 | | 0 |
| [489] | 111101001 | 1010000111 | | 0 |
| [490] | 111101010 | 1010000001 | 0101111110 | -4 |
| [491] | 111101011 | 1010000011 | 0101111100 | -2 |
| [492] | 111101100 | 1010001101 | | 0 |
| [493] | 111101101 | 1010001111 | 0101110000 | 2 |
| [494] | 111101110 | 1010001001 | 0101110110 | -2 |
| [495] | 111101111 | 1010001011 | | 0 |
| [496] | 111110000 | 1111100000 | | 0 |
| [497] | 111110001 | 1010110111 | 0101001000 | 4 |
| [498] | 111110010 | 1010110001 | | 0 |
| [499] | 111110011 | 1010110011 | 0101001100 | 2 |
| [500] | 111110100 | 1010111101 | 0101000010 | 4 |
| [501] | 111110101 | 1010110101 | 0101001010 | 2 |
| [502] | 111110110 | 1010111001 | 0101000110 | 2 |
| [503] | 111110111 | 1010111011 | 0101000100 | 4 |
| [504] | 111111000 | 1010100101 | | 0 |
| [505] | 111111001 | 1010100111 | 0101011000 | 2 |
| [506] | 111111010 | 1010100001 | 0101011110 | -2 |
| [507] | 111111011 | 1010100011 | | 0 |
| [508] | 111111100 | 1010101101 | 0101010010 | 2 |
| [509] | 111111101 | 1010101111 | 0101010000 | 4 |
| [510] | 111111110 | 1010101001 | | 0 |
| [511] | 111111111 | 1010101011 | 0101010100 | 2 |

TABLE 1h

IN-BAND SIGNAL OR SPECIAL CODE WORD

| CHARACHER NO | SOURCE DATE BIT FORMAT | CODE WORD | COMPLEMENT WORD | D |
|---|---|---|---|---|
| [i55] | 000110111 | 0100111011 | 1011000100 | 2 |
| [i115] | 001110011 | 0110110011 | 1001001100 | 2 |
| [i151] | 010010011 | 0001111011 | 1110000100 | 2 |
| [i179] | 010110011 | 0000110011 | 1111001100 | -2 |
| [i181s] | 010110101 | 0000111111 | 1111000000 | 2 |
| [i211] | 011010011 | 0011110011 | 1100001100 | 2 |
| [i227] | 011100011 | 0010010011 | 1101101100 | -2 |
| [i241] | 011110001 | 0010110111 | 1101001000 | 2 |
| [i242] | 011110010 | 0010110001 | 1101001110 | -2 |
| [i295] | 100100111 | 1100011011 | 0011100100 | 2 |
| [i310] | 100110110 | 1100111001 | 0011000110 | 2 |
| [i358] | 101100110 | 1110011001 | 0001100110 | 2 |
| [i391] | 110000111 | 1001011011 | 0110100100 | 2 |

TABLE 1h-continued

IN-BAND SIGNAL OR SPECIAL CODE WORD

| CHARACHER NO | SOURCE DATE BIT FORMAT | CODE WORD | COMPLEMENT WORD | D |
|---|---|---|---|---|
| [i406] | 110010110 | 1001111001 | 0110000110 | 2 |
| [i421] | 110100101 | 1000011111 | 0111100000 | 2 |
| [i422] | 110100110 | 1000011110 | 0111100110 | −2 |
| [i436] | 110110100 | 1000111101 | 0111000010 | 2 |
| [i454] | 111000110 | 1011011001 | 0100100110 | 2 |
| [i482] | 111100010 | 1010010001 | 0101101110 | −2 |
| [i484] | 111100100 | 1010011101 | 0101100010 | 2 |

Note:
1. D represents a disparity of a code word. Therefore, the disparity of a complement code word is −D.
2. s in [ ]represents a character used as a synchronization pattern. The synchronization pattern is generated in a form of consecutive two code words. In this case, a running digital sum may become +6 or = −6. The bit stream with respect to the synchronization pattern is $C_{16}, C_{15}, C_{14}, C_{13}, C_{12}, C_{11}, C_{10}, C_9, C_8, C_7, C_6, C_5, C_4, C_3, C_2, C_1$ among [i181s][...s].
Here, [i181s] is formed of $C_{19}, C_{18}, C_{17}, C_{16}, C_{15}, C_{14}, C_{13}, C_{12}, C_{11}$ [...s] is formed of $C_9, C_8, C_7, C_6, C_5, C_4, C_3, C_2, C_1, C_0$. For example, the synchronization pattern is 1000000010000100 or 0111111101111011.
3. i in [ ] represents an in-band signal or a special character.

SYNC.CODE WORD PATTERN

| SYNC.CHARACTER COMBINATION | | SYNC.PATTERN BIT FORMAT |
|---|---|---|
| [i181s] | [...s] | $C_{16}C_{15}C_{14}C_{13}C_{12}C_{11}C_{10}C_9C_8C_7C_6C_5C_4C_3C_2C_1$ COMPLEMENT (VERSION) |
| [i181s] | [46s] | 0111111101111011 (1000000010000100) |
| [i181s] | [58s] | 0111111101101111 (1000000010010000) |
| [i181s] | [139s] | 0111111111011110 (1000000000100001) |
| [i181s] | [154s] | 0111111111001111 (1000000000110000) |
| [i181s] | [163s] | 0111111111110110 (1000000000001001) |
| [i181s] | [178s] | 0111111111100111 (1000000000011000) |
| [i181s] | [226s] | 0111111110110111 (1000000001001000) |

The NIBI decoding rules are the reversed operation of the NIBI encoding rules. Source data is 9-bit character, the coded block is called the code word. The block is composed of c8, c7, c6, c5, c4, c3, c2, c1, c0, and NII. The code word is divided into the odd bit nibble and the even bit nibble. The odd bit nibble consists of c7, c5, c3, c1, and NII, the even nibble consists of c8, c6, c4, c2, and c0. The odd bit nibble inversion takes the complement of the odd bit nibble to generate <u>c7</u>, <u>c5</u>, <u>c3</u>, <u>c1</u>, and NII, where c7 is the complement of c7. If the code word is c(9:0), the block inversion is the complement of the code word, c(9:0). The NIBI decoding rules are described using a flow chart in FIG. 2.

For the convenience of computing disparity and the simplicity of implementing hardware, the NIBI decoder calculates odd bit nibble disparity (Dcw o) of the code word and even nibble disparity (Dcwe), and adds odd bit nibble disparity to even nibble disparity to calculate the disparity of the code word (Dcw). The even bit nibble disparity (Dcwe) can be used to calculate disparity (Dni) for the odd bit nibble inverted code word. RDS sums up the disparity of the each code word; RDS of NIBI code is 6 at the maximum, and −6 at the minimum. If RDS is greater than +6 or RDS is less than −6, it means that code violation occurred. The decoding rules according to the NIBI coding types are as follows:

1. If Dcw=0 and NII=0, a decoded character is a code word except for NII bit (Type 1A).
2. If Dcw=+/−2 or Dcw=+/−4 and Dni 0, and if NII=0, it generates a character by taking the NII bit out of the nibble inverted code words to make characters. If NII=1, it generates a character by taking the NII bit out of the code words to make characters (Type 2).
3. If Dcw=+/−2 and Dni=0, it makes bit-comparison to distinguish whether the code word is Type 3ANB/C. And then it bit-manipulates the code word according to the type, runs process 2 described above again for the bit-manipulated code word to generate character (Type 3A, Type 3B and Type 3C).

If Dcw 0 and Dni=0 and c7=<u>c5</u>=c3=<u>c1</u>=<u>NII</u> and not c8=c6=c4 (c8≠c6 or c6≠c4 or c8≠c4), it inverts c7 and c3 in the code word, respectively. If NII of the bit-manipulated code word is 0, the decoded character is the bit-manipulated and nibble-bit-inverted code word except for NII. If NII=1, the decoded character is the code word except for NII (Type 3A).

If Dcw≠0 and Dni=0 and <u>c7</u>=c5=c3=<u>c1</u>=<u>NII</u> and c8=c6=c4, or if Dcw=+/−2 and Dni=0 and c8=c6=c4=<u>c2</u>=<u>c0</u>, it inverts c2 and c0 in the code word, respectively. If NII of the bit-manipulated code word is 0, the decoded character is the bit-manipulated and nibble-bit-inverted code word except for NII. If NII=1, the decoded character is the code word except for NII (Type 3B).

If Dcw≠0 and Dni=0 and <u>c7</u>=c5=c3=<u>c2</u>=<u>c1</u>=<u>NII</u> and c2=c1=<u>c0</u>=NII, if or Dcw 0 and Dni=0 and <u>c7</u>=c6=c5=c3=<u>c1</u>=<u>NII</u> and c2=c1=<u>c0</u>=NII, it inverts c5, c4, c3 and c2 in the code word, respectively. If NII of the bit-manipulated code word is 0, the decoded character is the bit-manipulated and nibble-bit-inverted code word except for NII. If NII=1, the decoded character is the code word except for NII (Type 3C).

4. If Dcw=+/−2 and Dni=0, it makes bit-comparison on the code word to see whether the code word is Type 4A/B. And then it bit-manipulates the code according to the type, runs process 2 described above again to recover characters (Type 4A, Type 4B).

If Dcw≠0 and Dni=0 and <u>c7</u>=c5=c3=c2=c1=<u>NII</u> and, or if Dcw=+/−2 Dni=0 and c8=c7=c6=<u>c4</u>=<u>c2</u>=c0, it inverts c5, c4, c3, c2, and c1 in the code word, respectively. If NII of the bit-manipulated code word is 0, the decoded character is the bit-manipulated and nibble-bit-inverted code word except for NII. If NII=1, the decoded character is the code word except for NII (Type 4A).

If Dcw 0 and Dni=0 and c8=<u>c6</u>=<u>c4</u>=<u>c2</u>=c1=c0, or Dcw≠0 and Dni=0 and <u>c7</u>=c5=c3=<u>c2</u>=<u>c1</u>=<u>NII</u> and not c2=c1=<u>c0</u>=NII, or Dcw≠0 and Dni=0 and <u>c7</u>=c6=c5=c3=<u>c1</u>=<u>NII</u> and not c2=c1=<u>c0</u>=NII, it inverts c6, c5, c4, c3 and c2 in the code word, respectively. If NII of the bit manipulated code word is 0, it generates a character by taking the NII bit out of the nibble inverted code words to make characters. If NII=1, it generates a character by taking the NII bit out of the code words to make characters (Type 4B).

5. If Dcw=+/−2 and Dni=0 and c3=NII and c8=<u>c4</u>=<u>c0</u>, or if Dcw=+/−2 and Dni=0 and c3=NII and c8=c2, then the code word is the in-band signaling/special code word. If NII of the bit manipulated code word is 0, it generates a character by taking the NII bit out of the nibble inverted code words to make characters. If NII=1, it generates a character by taking the NII bit out of the code words to make characters (Type 1B).
6. If Dcw=+/−6 or Dcw=+/−8 or Dcw=+/−10, it means that there is a code violation.

7. If |RDS|>6, it means that there is a code violation.

The coder and decoder for performing a NIBI coding method and a NIBI decoding method according to the present invention will be explained with reference to the accompanying drawings.

Figure 1B:
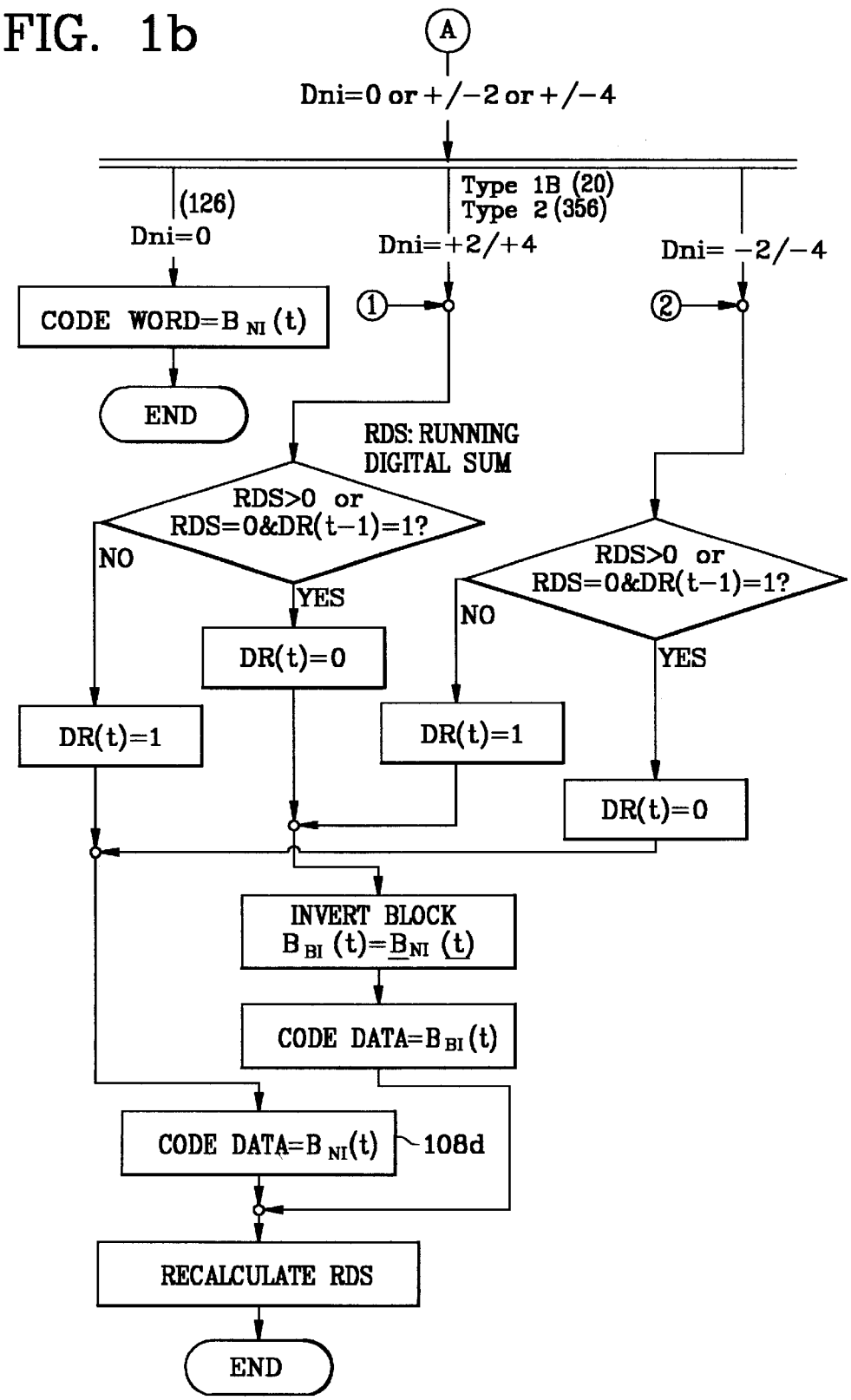
Figure 1C:
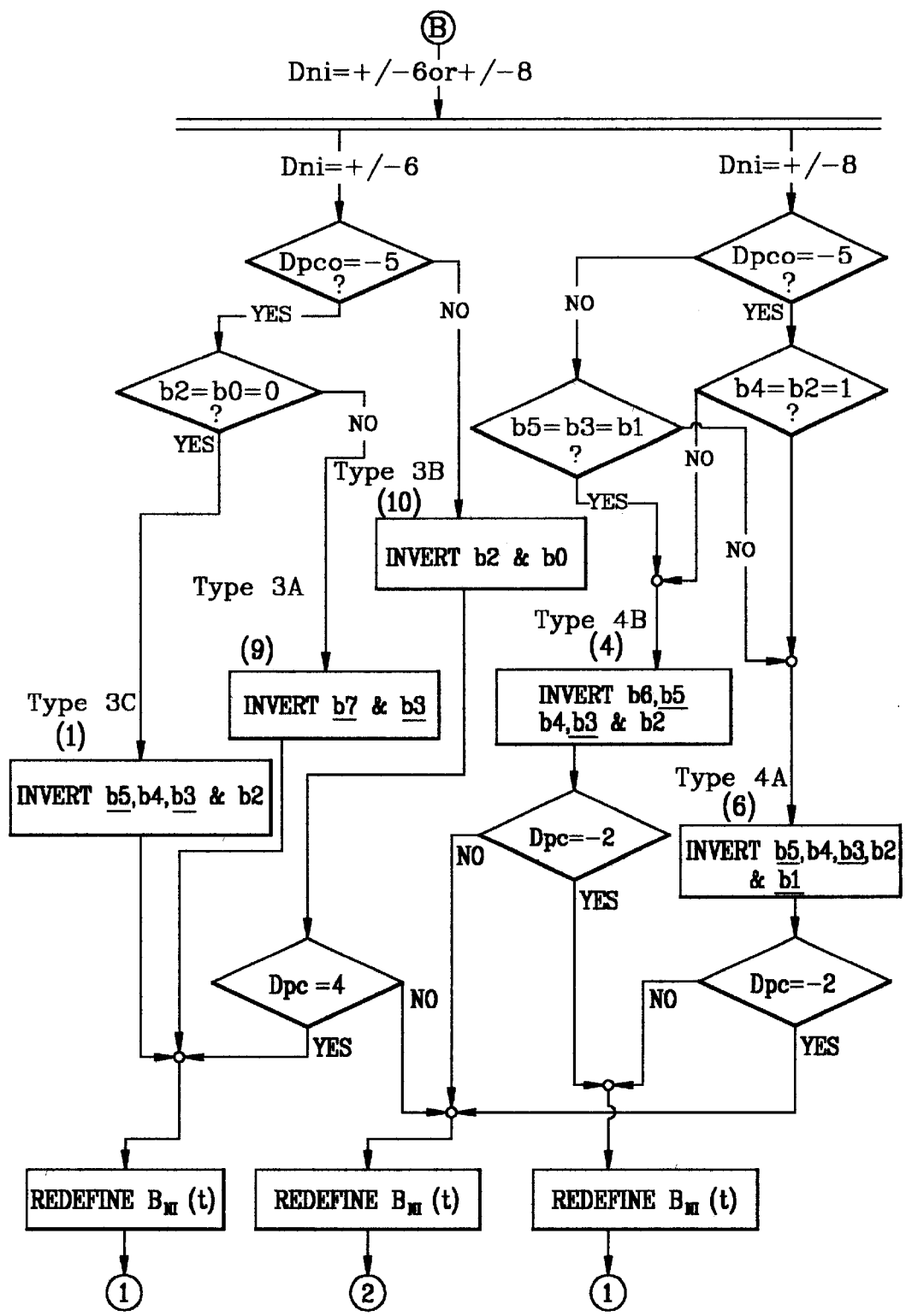
Figure 2A:
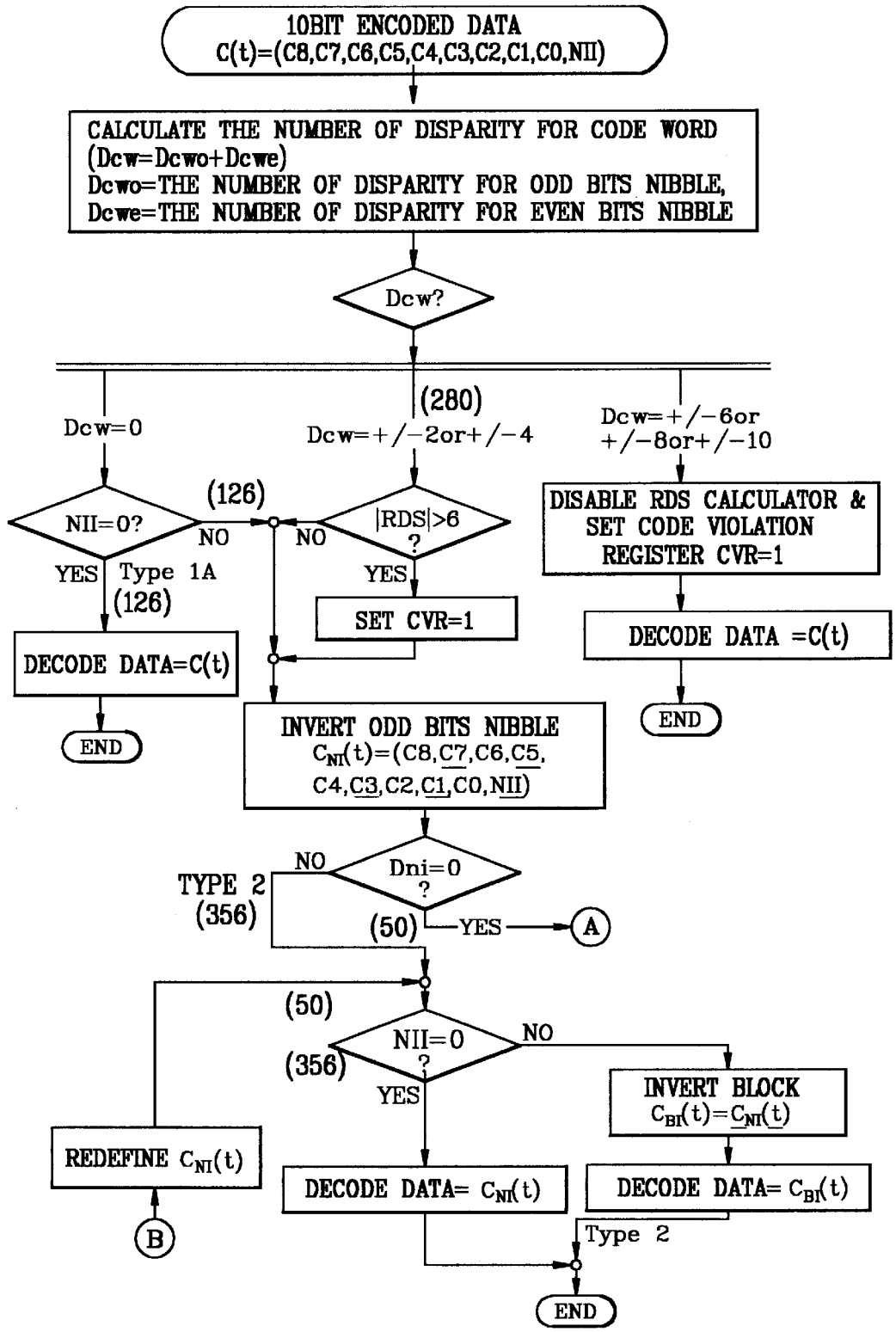
FIGS. 2A and 2B are flow charts illustrating a NIBI decoding operation according to the present invention.
Figure 2B:
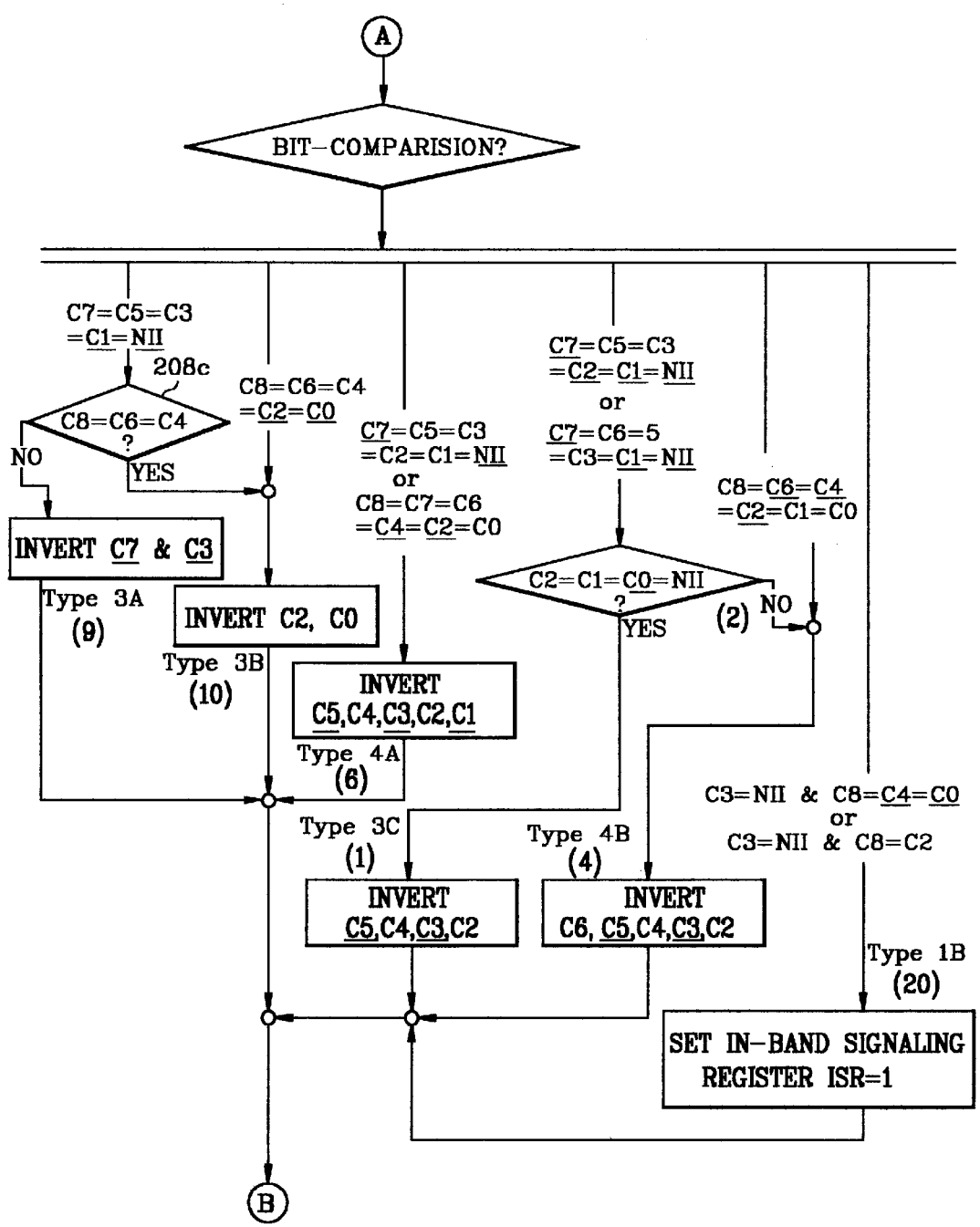

In the coding and decoding method for the NIBI as shown in FIG. 1 and 2, it looks very difficult. Actually, it is very simple due to its symmetrical feature and a rule in the NIBI code and decode rule. The NIBI coder and decoder are not limited by the number of bits of the source data. If the number of bits of the source data is increased, it is hard to configure the hardware. In the present invention, the NIBI coder and decoder will be explained in the case that the source data is formed of 9-bit character for being applicable to a widely used byte (8-bit) unit application.

Figure 3:
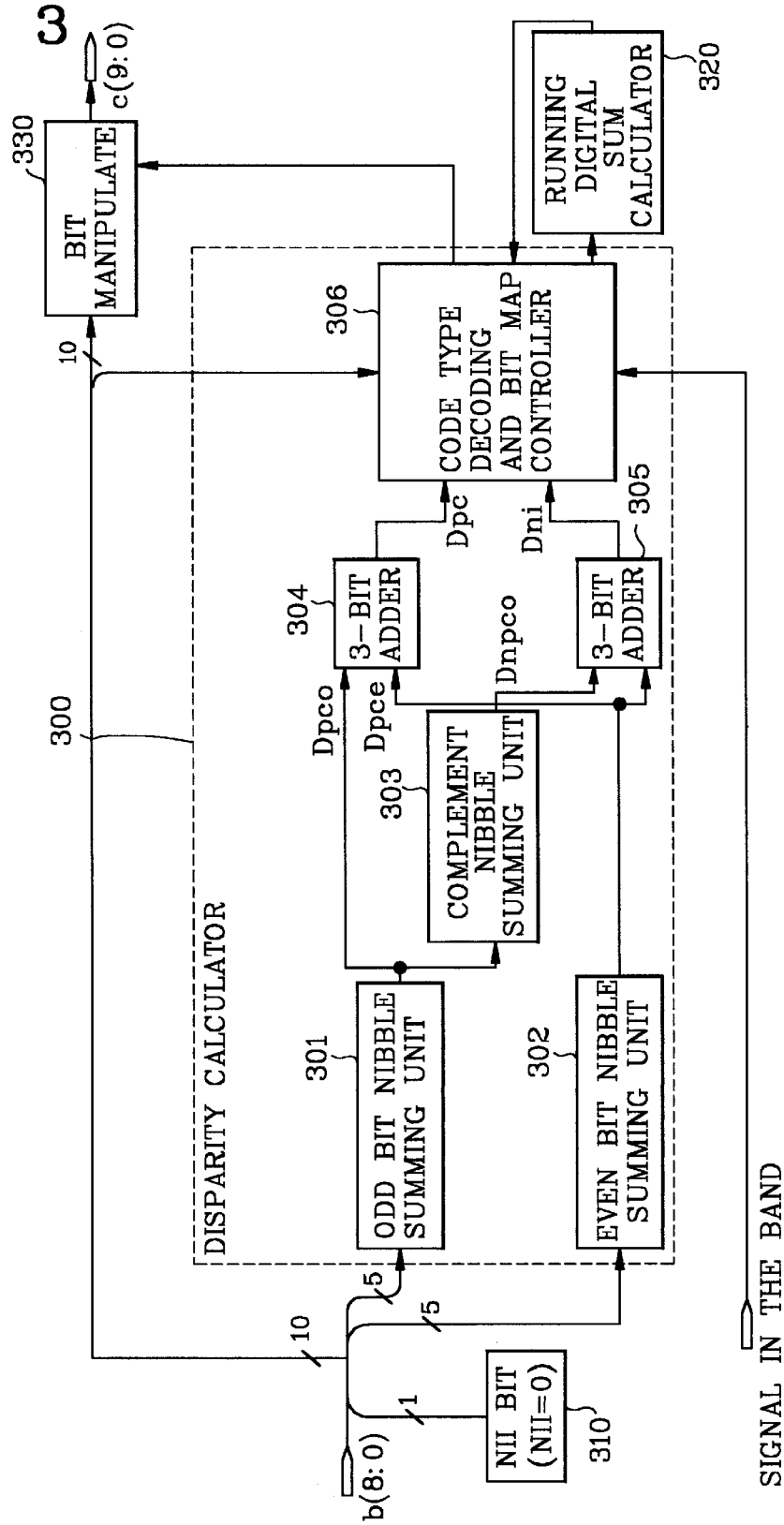
FIG. 3 is a block diagram illustrating a NIBI coding apparatus according to the present invention.

The construction and operation of the NIBI coder according to the present invention will now be explained with reference to FIG. 3.

The NIBI coder may be formed of a simple hardware. But, for easily maintaining a predetermined rule and symmetrical characteristic, the construction as shown in FIG. 3 is needed.

The 10-bit pre-code which is generated by adding the NII bit (310) into the position next to the LSB of the 9-bit character b(8:0) is inputted into the disparity calculator 300. The disparity calculator 300 is formed of an odd bit nibble summing unit 301, an even bit nibble summing unit 302, a complement nibble summing unit 303, a 3-bit adder 304, and an encoding type decoder and bit map controller 306.

The odd bit nibble summing unit 301 sums the number of 1 (ones) of the odd bit nibble, and the even bit nibble summing unit 302 sums the number of 1 (ones) of the even bit nibble. The complement nibble summing unit 303 does not compute the number of 1 (ones) of the odd bits inverting the odd bit nibble when computing the number of 1 with respect to the complement of the odd bit nibble and complements the result value of the odd bit nibble summing unit. The 3-bit adders 304 and 305 are a known 3-bit full adder. The first 3-bit adder 304 sums the result Dpco of the odd bit nibble summing unit 301 and the result Dpce of the even bit nibble summing unit 302 for thereby computing the disparity Dpc of the pre-code. The second 3-bit adder 305 sums the result Dnpco of the complement nibble summing unit 303 and the result Dpce of the even bit nibble summing unit 302 for thereby computing a disparity Dni of the odd bit nibble inverted pre-code. The code type encoding and bit map controller 306 encodes the coding type based on the NIBI coding method in accordance with the disparity Dpc of the pre-code, a disparity Dni of the nibble-inverted pre-code, the in-band signal, the disparity register, RDS(320) and a character and generates a control signal for manipulating the bits of the pre-code.

The RDS calculator 320 performs a function of accumulative summing the disparity of an individual code word generated by the unit of blocks and outputs a value of RDS for selecting the code word or the complement code word when the disparity of the code word is not 0.

The bit manipulator 330 selects the NIBI code type in accordance with a control signal of the code type decoding and bit map controller 306 and manipulates the bit of the pre-code for thereby generating a code word or complement code word.

Figure 4:
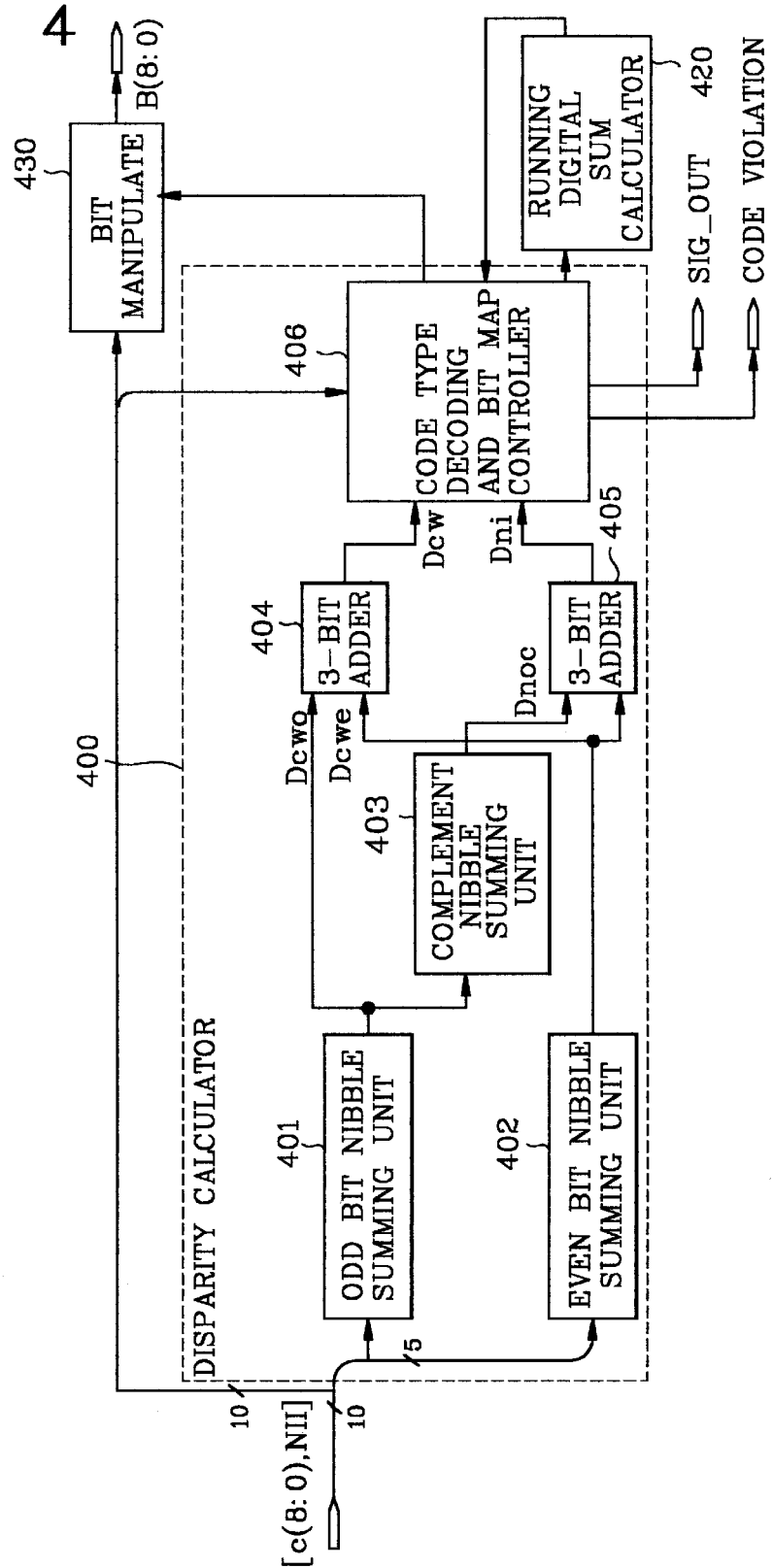
FIG. 4 is a block diagram illustrating a NIBI decoding apparatus according to the present invention.

The construction and operation of the NIBI decoder according to the present invention will be explained with reference to FIG. 4.

Next, the NIBI decoder may be formed in various structures as the case of NIBI coder. For implementing a simple hardware and a rule and symmetrical characteristic, the construction as shown in FIG. 4 may be implemented.

The frame synchronization or block synchronization is performed based on a unique pattern detection method used by a synchronization code character among the NIBI code words. Therefore, it is assumed that the code word inputted into the NIBI decoder is block-synchronized.

The block-synchronized code word c(8:0) NII is inputted into the disparity calculator 400.

The disparity calculator 400 includes an odd bit nibble summing unit 401, an even bit nibble summing unit 402, a complement nibble summing unit 403, 3-bit adders 404 and 405, and a decode type decoding and bit map controller 406.

The odd bit nibble summing unit 401 sums the number of 1(ones) of the odd bit nibble of the code word. The even bit nibble summing unit 402 sums the number of 1 (ones) of the even bit nibbles. The complement nibble adder 403 does not calculate the number of 1 (ones) of the complement of odd bit nibble but calculates the result value of the odd bit nibble summing unit when computing the number of 1 (ones) with respect to the complement of the odd bit nibble. The 3-bit adders 404 and 405 are a known 3-bit full adder. The first 3-bit adder 404 sums the result Dpco of the odd bit nibble summing unit 401 and the result Dcwe of the even bit nibble summing unit 402 for thereby computing the disparity Dcw of the code word. The second 3-bit adder sums the result Dncwo of the complement nibble summing unit 403 and the result Dcwe of the even bit nibble summing unit 402 for thereby computing the disparity Dni of the odd bit nibble-inverted code word. The decoding type decode and bit map controller decodes the decoding type based on the NIBI decoding method in accordance with a code word disparity Dcw, a nibble-inverted code word disparity Dni, and a code word bit pattern and generates a control signal for manipulating the bits of the code word. If the decoded decode type is Type 1B, it is an in-band signal (or special) code word, the signal SIG_OUT is outputted independently from the decoded character. In addition, the disparity Dcw of the code word and RDS are checked, and if |Dcw|>4 or |RDS|>6, a code violation signal is outputted.

The RDS calculator 420 performs a function of accumulative summing the disparity of the individual code word generated by the unit of the blocks. If |RDS|>6 in accordance with the NIBI decoding method, it represents that there is a code violation in the code word stream.

The bit manipulator 430 selects a NIBI decoding type in accordance with a control of the decoding type decode and bit map controller, manipulates the bits of the code word and recovers the original character.

As described above, in the coding and decoding method with respect to the code according to the present invention, the number of odd bits of the source data is not limited. In the construction and operation of the present invention, the source data formed of 9-bit is used for an easier understanding and application. In the NIBI coding method with respect to the source data, the bit arrangement may be changed in the method for manipulating the bits. However, the basic principle is not lost. Also, the nibble means only the bit-order-independent half code of the pre-code that one bit is added to the source data.

As described above, in the present invention, since the character formed of odd bits is coded as a code word, the present invention is applicable to a system for transmitting a source data and an out-band signal and a system and storing apparatus for transmitting at a near distance when the bit sum forming the character of the source data and the out-band character exceeds 8-bit. In the present invention, the clock recovery is implemented and the line code may be substituted with a line code which does not have a DC spectrum component used for the conventional transmission and interconnection. In addition, the present invention has the following advantages.

First, only one redundancy bit is used for a coding operation.

Second, even when the source byte is formed of bytes other than more than 90% of the coding method according to the present invention may be directly used.

Third, various frame synchronization patterns are available in the present invention.

Fourth, in-band signals and out-band signal are fully provided.

Fifth, since the code and decode rule has a symmetrical and repeating characteristic, it is possible to easily implement a hardware.

Sixth, since the coding and decoding operation is implemented based on the unit of characters, the process is implemented at a low speed.

Although the preferred embodiments of the present invention have been disclosed for illustrative purposes, those skilled in the art will appreciate that various modifications, additions and substitutions are possible, without departing from the scope and spirit of the invention as recited in the accompanying claims.

What is claimed is:

1. A method for coding a line code used for a transmission, an interconnection and storing apparatus, comprising:

a first step for adding a one redundancy bit with respect to a n-bit (n represents an odd number higher than 3) source data to generate a pre-code;

a second step for setting the pre-code as a code word when a disparity of the pre-code generated in the first step is 0 and the source data is not an in-band signal (or special character);

a third step for inverting a half block (nibble) including a redundancy bit among the bits (block) forming a pre-code when the disparity of the pre-code generated in the first step is 0 and the source data is a set in-band signal (or special character), setting the nibble-inverted pre-code as a code word and generating a complement code word which is a block-inverted code word version and a code word;

a fourth step for nibble-inverting a pre-code when the disparity of the pre-code generated in the first step is not 0, setting a nibble-inverted pre-code as a code word when the disparity of the nibble-inverted pre-code is within a predefined value and generating a complement code word which is a block-inverted code word and a code word when the disparity of the set code word is not 0;

a fifth step for nibble-inverting the pre-code when the disparity of the pre-code generated in the first step is not 0, manipulating the bits of the pre-code when the disparity of the nibble-inverted pre-code is not within a predefined value, manipulating the bits of the pre-code so that the disparity of the nibble-inverted pre-code is within a predefined value when the disparity of the manipulated pre-code is 0 and concurrently manipulated, setting the manipulated and nibble-inverted pre-code as a code word, and generating a complement code word which is a block-inverted code word version and a code word when the disparity of the set code word is not 0;

a sixth step for selecting a code word in which the absolute value of the running digital sum (RDS) is decreased when the code with respect to the source data exists as two values of a complement code word and a code word; and a seventh step for combining the code words for a frame synchronization and generating a synchronization code word so that a pattern is formed from a serial bit stream when the code word is converted from a parallel form to a serial form.

2. In a method for decoding a line code used for a transmission, an interconnection and storing apparatus, comprising the steps of:

a first step for decoding a source data using the bits except for a redundancy bit from a code-word when a disparity of a code word is 0 and a redundancy bit is not inverted;

a second step for nibble-inverting half bits (nibble) including a redundancy bit among the bits of the code word when the disparity of the code word is 0 and the redundancy bit is inverted and decoding a source data using the bits except for the redundancy bit of the nibble-inverted code word;

a third step for nibble-inverting half bits including a redundancy bit among the bits of the code word when the disparity of the code word is not 0 and has a predefined value and decoding a source data using the bits except for the redundancy bits from the code word when the disparity of the nibble-inverted code word is not 0 and the redundancy bit of the nibble-inverted code word is not inverted;

a fourth step for nibble-inverting when the disparity of the code word is not 0 and has a predefined value, block-inverting the bits (block) of a decoded word when the disparity of the nibble-inverted code word is not 0 and the redundancy bit of the nibble-inverted code word is inverted;

a fifth step for nibble-inverting when the disparity of the code word is not 0 and has a predefined value, nibble-inverting when the disparity of the nibble-inverted code word is 0 and is a synchronization or in-band signal (or special) code word, indicating an in-band signal (or special) character signal decoding the source data using the bits except for the redundancy bit from the block-inverted code word when the redundancy bit of the nibble-inverted code word is inverted, decoding the source data using the bits except for the redundancy bit from the nibble-inverted code word when the redundancy bit of the nibble-inverted code word is not inverted, and indicating an in-band signal (or special) character signal;

a sixth step for nibble-inverting when the disparity of the code word is not 0 and has a predefined value, nibble-inverting after searching and recovering the manipulated bits when the disparity of the nibble-inverted code word is 0 and a bit-manipulated code word, decoding a source data using the bits except for the redundancy bits from the block-inverted code word when the redundancy bit of the recovered and nibble-inverted code word is inverted, and decoding the source data using the bits except for the redundancy bit from the recovered and nibble-inverted code word when the redundancy bit of the nibble-inverted code word is not inverted;

a seventh step for decoding based on the above-described condition and process when a predefined frame synchronization pattern is detected from the code word stream and decoding a synchronization character; and an eighth step for detecting the code word as a violation when the running digital sum exceeds a predefined value or the disparity of the code word exceeds a predefined value.

3. An apparatus for coding a line code used for a transmission, an interconnection and storing apparatus, comprising:

a disparity calculator for receiving a pre-code in which a nibble-inverted indication (NII) bit is added at the position next to the LSB of a source data of a n-bit (n represents an odd number higher than 3), computing a disparity Dpc value of the pre-code, computing a disparity value Dni of the odd bit nibble-inverted pre-code, decoding a code type in accordance with the value of the register and the value of the running digital sum RDS which represent the disparity code and outputting a control signal for manipulating the bits of the pre-code;

a RDS calculator for outputting a RDS value which is obtained by accumulatively summing the disparity of the calculated code word by the unit of blocks for selecting a code word or a complement code word when the computed disparity Dpc is not 0; and a bit manipulator for selecting a nibble-inverted and block-inverted NIBI) code type in accordance with a control signal from the disparity calculator, manipulating a bit of the inputted pre-code and generating a code word or a complement code word.

4. The apparatus of claim 3, wherein said disparity calculator includes:

an odd bit nibble summing unit for summing the number of 1 (ones) of the odd bit nibble contained in the inputted pre-code;

an even bit nibble summing unit for summing the number of 1 (ones) of the even bit nibble contained in the inputted pre-code;

a complement nibble summing unit for computing the number of 1 (ones) by compensating the result value computed by the odd bit nibble summing unit;

a first 3-bit adder for adding the result Dpco of the odd bit nibble summing unit and the result Dpce of the even bit nibble summing unit and computing a disparity Dpc of the pre-code;

a second 3-bit adder for computing the disparity Dni of the odd bit nibble-inverted pre-code by adding the result Dnpco of the complement nibble summing unit and the result Dpce of the even bit nibble summing unit; and a code type decoding and bit map controller for decoding a code type in accordance with a disparity Dopc of the pre-code, a disparity Dni of the nibble-inverted pre-code, an in-band signal (or special character), a value of a disparity register and a RDS value outputted from the RDS calculator and generating a control signal for manipulating the bits of the pre-code.

5. An apparatus for decoding a nibble inversion and block inversion (NIBI) that a line code is coded for use in a transmission, an interconnection and storing apparatus, comprising:

a disparity calculator for receiving a block synchronized code word, calculating a disparity Dcw of the code word, computing a disparity Dni of the nibble-inverted code word, decoding a NIBI decoding type in accordance with a computed disparity value and a bit pattern of a code word and generating a control signal for manipulating the bits of the code word;

a RDS calculator for outputting a RDS value which is obtained by accumulatively summing the disparity Dni of the computed code word by the unit of blocks; and a bit manipulator for selecting a NIBI decoding type in accordance with a control signal of the disparity calculator, manipulating a bit of the code word, and recovering the original character.

6. The apparatus of claim 5, wherein said disparity calculator includes:

an odd bit nibble summing unit for summing the number of 1 (ones) of the odd bit nibble of the code word;

an even bit nibble summing unit for summing the number of 1(ones) of the even bit nibble of the code word;

a complement nibble summing unit for compensating the result value of the computed odd bit nibble summing unit and computing the number of 1 (ones) with respect to the complement of the odd bit nibble;

a first 3-bit adder for adding the result Dpco of the odd bit nibble summing unit and the result Dcwe of the even bit nibble summing unit and computing the disparity Dcw of the code word;

a second 3-bit adder for adding the result Dncwo of the complement nibble summing unit and the result Dcwe of the even bit nibble summing unit and computing a disparity Dni of the odd bit nibble-inverted code word; and a decoding type decode and bit map controller for decoding the decode type in accordance with the disparity Dcw and Dni and the bit pattern of the code word, generating a control signal for manipulating the bits of the code word, outputting a signal indicating that the decoded decode type is an in-band signal (or special) code word separately from the decoded character, checking the disparity Dcw and the RDS value and outputting a code violation signal when $|Dcw|>4$ or $|RDS|>6$.

* * * * *